(12) United States Patent
Tsunemine

(10) Patent No.: US 6,384,443 B1
(45) Date of Patent: May 7, 2002

(54) STACKED CAPACITOR AND METHOD OF MANUFACTURING SAME

(75) Inventor: Yoshikazu Tsunemine, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/713,238

(22) Filed: Nov. 16, 2000

(30) Foreign Application Priority Data

Nov. 18, 1999 (JP) ............................................. 11-328164
Jul. 5, 2000 (JP) ......................................... 2000-203439

(51) Int. Cl.$^7$ ..................... H01L 27/108; H01L 31/119; H01L 31/113
(52) U.S. Cl. ........................ 257/303; 257/304; 257/305; 257/386
(58) Field of Search ................................. 257/303, 304, 257/305, 386, 71

(56) References Cited

U.S. PATENT DOCUMENTS

| | | | | |
|---|---|---|---|---|
| 5,066,612 A | * | 11/1991 | Ohba et al. .................. | 437/192 |
| 5,418,388 A | | 5/1995 | Okudaira et al. | |
| 5,989,953 A | * | 11/1999 | Liang et al. ................. | 438/253 |
| 6,174,767 B1 | * | 1/2001 | Chi ............................. | 438/253 |
| 6,214,663 B1 | * | 4/2001 | Cho et al. ..................... | 438/253 |

FOREIGN PATENT DOCUMENTS

| | | |
|---|---|---|
| JP | 10-242271 | 9/1998 |
| JP | 10-308446 | 11/1998 |
| JP | 11-17143 | 1/1999 |

* cited by examiner

Primary Examiner—Howard Weiss
Assistant Examiner—Shrinivas H. Rao
(74) Attorney, Agent, or Firm—Oblon, Spivak, McClelland, Maier & Neustadt, P.C.

(57) ABSTRACT

Provided are a method of manufacturing a stacked capacitor with which it is easy to fabricate even when a noble metal such as platinum is used for a lower electrode, and a stacked capacitor which can suppress a chemical reaction between a dielectric film or a sidewall lower electrode and a conductive plug. The method comprises the steps of: forming an insulating film (4); forming a film to be etched on the insulating film (4); forming a pattern for a lower electrode core (5A) which extends through the film to be etched and the insulating film (4) and extends to part of a conductive plug (3); burying a material for the lower electrode core (5A) into the pattern; burying a top insulating film (6A) and removing the film to be etched; depositing a material for a sidewall lower electrode (7A) and performing an etch back; and forming a dielectric film (8) and upper electrode (9). The occurrence of chemical reaction can be suppressed because the insulating film (4) prevents the conductive plug (3) from making contact with the dielectric film (8) or the sidewall lower electrode (7A).

6 Claims, 35 Drawing Sheets

<PRIOR ART>

<PRIOR ART>

STACKED CAPACITOR AND METHOD OF MANUFACTURING SAME

BACKGROUND OF THE INVENTION

1. Field of the Invention

The present invention relates to a stacked capacitor in which a high-dielectric constant material is used in a dielectric film, as well as a method of manufacturing the same.

2. Description of the Background Art

A DRAM (dynamic random access memory) is generally composed of a memory array block that is a storage area for storing a plenty of memory data, and a peripheral circuit block needed in handling input/output operation to the exterior. In the memory array block occupying a large area on a semiconductor chip, a plurality of memory cells storing unit memory data are disposed in a matrix.

A single memory cell is generally composed of one MOS transistor and one capacitor connected thereto. This memory cell is called "one-transistor one-capacitor type memory cell." This type of memory cell has a simple configuration, thereby making it easy to improve the integration degree of a memory array. Therefore it has found wide use in mass DRAMs.

There are various types of capacitors, for example, a so-called stacked capacitor type. The stacked capacitor has the feature that the opposed-surface area between the capacitor electrodes is increased by allowing the electrode and dielectric film of the capacitor to extend above a field oxide film and above the gate electrode of a transistor. Since the stacked capacitor has this feature, it is easy to ensure the electrostatic capacity of the capacitor even when the scale down of elements is advanced with integration of semiconductor memory. Thus, the stacked capacitor has come into increasing use due to high integration of semiconductor memory.

When the scale down of elements is advanced, it requires that a stacked capacitor is made high for ensuring the opposed surface area between electrodes while minimizing its lateral extending. In its present state of a significant advancement of scale down, however, it is going to be no longer capable of securing a predetermined electrostatic capacity by such a method of improving the structure. This is true for trench capacitors and cylindrical capacitors which are of other typical three-dimensional capacitor structure.

Upon this, in order to increase the electrostatic capacity of capacitors, some attempts have been made to employ, as a dielectric film, a high-dielectric constant material such as BST (barium strontium titanate). FIG. 19 is a cross section illustrating a capacitor part of a DRAM memory cell in which a high-dielectric constant material, e.g., BST, is used as a dielectric film.

Referring to FIG. 19, a dielectric film 8 composed of a high-dielectric constant material is sandwiched by an upper electrode 9, lower electrode 5D and sidewall lower electrode 7D. The lower electrode 5D is connected to a conductive plug 3 via a barrier metal 13. The conductive plug 3 extends through an interlayer insulting film 2 and makes connection with the top surface of a semiconductor substrate 1. An interlayer insulating film 10 is disposed on the upper electrode 9. The dielectric film 8, upper electrode 9, barrier metal 13, lower electrode 5D and sidewall lower electrode 7D are insulated from the semiconductor substrate 1 by the interlayer insulating film 2. These components as described constitute a stacked capacitor.

For instance, platinum is used for the upper electrode 9, lower electrode 5D and sidewall lower electrode 7D, and titanium nitride is used for the barrier metal 13. The interlayer insulating films 2 and 10 are formed of a silicon oxide film or the like. The dielectric film 8 composed of a high-dielectric constant material, e.g., BST, is formed by means of reactive sputtering, CVD (chemical vapor deposition), or the like.

A transistor and an element isolation region comprising a silicon oxide film or the like, which are not shown in FIG. 19, are disposed on the top surface of the semiconductor substrate 1. Aluminum wiring, which is also not shown, is disposed above the stacked capacitor.

In the capacitor of conventional memory cells of a DRAM, polycrystalline silicon is used for upper and lower electrodes, and a silicon oxide film obtained by the thermal oxidation of silicon, or a silicon nitride film formed by CVD method, is used as a dielectric film. All of these films are of a silicon compound, and are easily formed on the lower electrode composed of polycrystalline silicon.

If an attempt were made to apply a dielectric film composed of BST to a conventional capacitor structure so that it is formed on a lower electrode composed of polycrystalline silicon, the polycrystalline silicon that is electrochemically base is easily oxidized with the oxygen atoms of the BST. As a result, a silicon oxide film is formed at the interface of the dielectric film and lower electrode. Since the silicon oxide film has a low dielectric constant, it nullifies the effect of the high-dielectric constant material, which causes a substantial reduction in the electrostatic capacity of the capacitor and also raises the resistance value of the polycrystalline silicon as the lower electrode. These problems also occur in the upper electrode.

Therefore, when a high-dielectric constant material, e.g., BST, is used for a dielectric film, a noble metal that is electrochemically noble and has strong oxidation resistance is used for upper and lower electrodes. Examples of the noble metal are platinum, iridium and palladium. For this reason, platinum is exemplified as the material of the upper electrode 9, lower electrode 5D and sidewall lower electrode 7D in the stacked capacitor shown in FIG. 19. The sidewall lower electrode 7D is provided in order to avoid that the barrier metal 13 makes a direct contact with the dielectric film 8 to cause a chemical reaction.

In the stacked capacitor of FIG. 19, when a material composed of silicon, e.g., polycrystalline silicon, is used for the conductive plug 3, unless the barrier metal 13 is present, silicidation might take place between the lower electrode 5D and conductive plug 3, resulting in an increase in resistance value. In addition, the oxygen atoms which departed from the dielectric film 8 or the like, and then penetrated the lower electrode 5D, may reach the conducive plug 3 and semiconductor substrate 1, thereby oxidizing them. It is therefore necessary to dispose a conductive barrier metal between the lower electrode 5D and conductive plug 3, by which the element diffusion therebetween is suppressed. The barrier metal 13 of FIG. 19 is provided for this reason.

In a conventional stacked capacitor employing a dielectric film composed of a high-dielectric constant material, a lower electrode 5D is shaped by dry etching.

FIG. 20 is a cross section illustrating a step in the course of manufacturing the lower electrode 5D. FIG. 20 shows the state that, by using a patterned resist 12 as a mask, the lower electrode 5D is subjected to a dry etching, thereafter, a barrier metal 13 is also subjected to a dry etching.

When a noble metal, e.g., platinum, is employed as a lower electrode 5D, the dry etching of the lower electrode 5D causes the problem that the etched noble metal particles tend to redeposit on the side surfaces of a resist 12 and the lower electrode 5D. For this reason, in FIG. 20, redeposit 14 is present on the side surfaces of the resist 12 and the lower electrode 5D.

Therefore, the pattern size b of the lower electrode 5D and barrier metal 13 to be provided after etching is greater than the pattern size a of the resist. This tendency increases with greater thickness of the lower electrode 5D to be etched. That is, the pattern size according to design cannot be achieved, which requires some corrective actions such that allowance should be made in the design of a circuit pattern, resulting in a tedious work.

Thus, a noble metal such as platinum has the advantage of being chemically stable, while it has the disadvantage of having difficulties in dry etching. It becomes therefore more difficult to prepare a minute lower electrode using a noble metal, e.g., platinum, as the integration of DRAMs is further advanced.

In the conventional stacked capacitor shown in FIG. 19, in order to increase the contact area between the conductive plug 3 and barrier metal 13, when the diameter of the conductive plug 3 is increased at low mask alignment accuracy, there is the possibility that the conductive plug 3 will make contact with the dielectric film 8 or the sidewall lower electrode 7D.

In the case that the dielectric film 8 is composed of BST and the conductive plug 3 is composed of polycrystalline silicon, when the conductive plug 3 and the dielectric film 8 come into contact with each other, there is the possibility that the polycrystalline silicon might be easily oxidized with the oxygen atoms of the BST. That is, the elements of the dielectric film 8 might reach the conductive plug 3, causing a chemical reaction. In contrast, there will be the possibility that the elements of the conductive plug 3 reach the dielectric film 8, causing a chemical reaction. Further, in the event that the sidewall lower electrode 7D makes contact with the conductive plug 3, a chemical reaction might take place therebetween, as in the case that the barrier metal 13 is absent as described.

Again in the event that the lower electrode 5D, sidewall lower electrode 7D and barrier metal 13 are further subjected to a lateral scale down and the diameter of the conductive plug 3 is thus relatively increased, at low mask alignment accuracy, there is the possibility that the conductive plug 3 and the dielectric film 8 or the sidewall lower electrode 7D might come into contact with each other.

SUMMARY OF THE INVENTION

According to a first aspect of the present invention, a stacked capacitor comprises: a substrate having a main surface; an interlayer insulating film disposed on the substrate; a conductive plug extending through the interlayer insulating film and reaching the main surface of the substrate; an insulating film covering the interlayer insulating film and the conductive plug; a first conductive layer extending through the insulating film and being connected to the conductive plug; a dielectric film disposed so as to cover the first conductive layer and the insulating film; and a second conductive layer disposed so as to cover the dielectric film.

According to a second aspect, the stacked capacitor of the first aspect further comprises: a top protective film disposed on the top surface of the first conductive layer; and a sidewall conductive layer disposed on side surfaces of the first conductive layer and the top protective film.

According to a third aspect, the stacked capacitor of the second aspect is characterized in that the top protective film is a conductive film.

According to a fourth aspect, the stacked capacitor of the second aspect further comprises a barrier metal conductive layer disposed between the sidewall conductive layer and the first conductive layer.

According to a fifth aspect, the stacked capacitor of the first aspect is characterized in that the first conductive layer has a taper.

According to a sixth aspect, the stacked capacitor of the first aspect is characterized in that the first conducive layer projects into a part the conductive plug and extends vertically from the conductive plug.

According to a seventh aspect, a method of manufacturing a stacked capacitor comprises the steps of: (a) preparing a substrate which has a main surface an interlayer insulating film formed on the main surface, and a conductive plug extending through the interlayer insulating film and reaching the main surface; (b) forming a film to be etched on the substrate; (c) forming a pattern so as to project into the conductive plug while extending upwards from the conductive plug and extending through the film to be etched; (d) forming a first conductive layer within the pattern; (e) removing the film to be etched; (f) forming a dielectric film so as to cover the first conductive layer; and (g) forming a second conductive layer so as to cover the dielectric film.

According to an eighth aspect, the method of the seventh aspect further comprises the step of (h) forming an insulating film having etching selectivity to the film to be etched, on the interlayer insulting film and the conductive plug, which step is performed before the step (b), wherein the pattern in the step (c) extends through the insulating film.

According to a ninth aspect, the method of the seventh or eighth aspect further comprises the step of (i) tapering the first conductive layer, which step is performed before the step (f).

According to a tenth aspect, the method of the seventh or eighth aspect further comprises the steps of: (j) forming a top protective film on the top of the first conductive layer, which step is included in the step (d); (k) forming a third conductive layer so as to cover the first conductive layer and the top protective film, which step is performed after the step (e); and (l) performing an etch back of the third conductive layer to form a sidewall conductive layer on side surfaces of the first conductive layer and the top protective film, which step is performed before the step (f).

According to an eleventh aspect, the method of the tenth aspect is characterized in that the top protective film in the step (j) is formed by thermal oxidation.

According to a twelfth aspect, the method of the tenth aspect is characterized in that the top protective film in the step (j) is a conductive film.

According to a thirteenth aspect, the method of the tenth aspect further comprises the steps of: (m) forming a fourth conductive layer so as to cover the first conductive layer and the top protective film, which step is performed after the step (e); and (n) performing an etch back of the fourth conductive layer to form a barrier metal conductive layer on side surfaces of the first conductive layer and the top protective film, which step is performed after the step (m) and before the step (k).

According to a fourteenth aspect, the method of the seventh or eighth aspect further comprises the step of (j) forming a top protective film which is a conductive film on the top of the first conductive layer, which step is included in the step (d), wherein the step (j) comprises the steps of: forming a replacement metal on the top of the first conductive layer; and replacing the replacement metal with the top protective film.

According to a fifteenth aspect, the method of the seventh or eighth aspect further comprises the step of (j) forming a top protective film which is a conductive film on the top of the first conductive layer, which step is included in the step (d), wherein the top protective film easily melts when heated, and the top protective film is heated so as to melt after formation of the top protective film in the step (j).

According to a sixteenth aspect, the method of the seventh or eighth aspect further comprises the step of (j) forming a top protective film which is a conductive film on the top of the first conductive layer, which step is included in the step (d), wherein the top protective film comprises first and second portions. The step (j) comprises the steps of: forming the first portion of the top protective film on the top of the first conductive layer; and employing a plating method using the first portion of the top protective film as an electrode, thereby further forming the second portion of the top protective film.

According to a seventeenth aspect, the method of the seventh or eighth aspect further comprises the step of (j) forming a top protective film which is a conductive film on the top of the first conductive layer, which step is included in the step (d). The step (j) comprises the steps of: forming the top protective film on the top of the first conductive layer and the film to be etched; forming a resist on the top protective film, the resist having a pattern covering the top of the first conductive layer; performing an etching of the top protective film using the resist as a mask, thereby removing a portion of the top protective film on the film to be etched which is not covered by the resist; removing the resist; and performing an etch back of the top protective film by a predetermined amount.

According to an eighteenth aspect, the method of the fourteenth or seventeenth is aspect further comprises the steps of: (k) forming a third conductive layer so as to cover the first conductive layer and the top protective film, which step is performed after the step (e); and (l) performing an etch back of the third conductive layer to form a sidewall conductive layer on side surfaces of the first conductive layer and the top protective film, which step is performed before the step (f).

With the stacked capacitor of the first aspect, the presence of the insulating film suppresses occurrence of a chemical reaction between the conductive plug and dielectric film.

With the stacked capacitor of the second aspect, the presence of the top protective film suppresses occurrence of a chemical reaction between the first conductive layer and dielectric film. Further, a chemical reaction between the conductive plug and sidewall conductive layer is suppressed by employing, as an insulating film, a material that can also suppress the mutual diffusion of the elements constituting the sidewall conductive layer and the elements constituting the conductive plug. In addition, the presence of the sidewall conductive layer prevents the first conductive layer from making a direct contact with the dielectric film. Thereby, a material that will cause a chemical reaction with the dielectric film can be used as the first conductive layer. If the sidewall conductive layer is tapered, it is hard to cause field concentration at the time of operation, thus leading to improved reliability and durability of the capacitor.

With the stacked capacitor of the third aspect, the area of the conductive portion in contact with the dielectric film is increased, permitting an increase in electrostatic capacity.

With the stacked capacitor of the fourth aspect, the presence of the barrier metal conductive layer suppresses occurrence of a chemical reaction between the first conductive layer and the sidewall conductive layer can be suppressed. Thereby, a material that will cause a chemical reaction with the sidewall conductive layer can be used as the first conductive layer.

With the stacked capacitor of the fifth aspect, due to the tapered first conductive layer, it is hard to cause field concentration at the time of operation, thus leading to improved reliability and durability of the capacitor.

With the stacked capacitor of the sixth aspect, the first conductive layer is hard to tumble during the manufacturing steps, because the first conductive layer projects into the conductive plug. When the top surface of the conducive plug is not completely covered with the first conducive layer, the contact area between the first conductive layer and conductive plug is increased by the amount of the side surface corresponding to projected portion, as compared with the case of having no projection. Thereby, the resistance between the first conductive layer and conductive plug is lowered.

With the method of manufacturing a stacked capacitor according to the seventh aspect, a pattern is formed within a film to be etched in order to form a first conducive layer. Therefore, the first conductive layer can be formed as a slender lower electrode by that a material which is easy to fabricate and has a large thickness is used for a film to be etched, and a pattern having a narrow width is formed in the film to be etched. In addition, since the first conductive layer is formed so as to project into the conductive plug, it is hard to tumble or displace when the film to be etched is removed in the step (e).

The method of the eighth aspect can manufacture the stacked capacitor of the first or sixth aspect. Because an insulating film that has etching selectivity against a film to be etched is formed beneath the film to be etched, the insulating film can be utilized as an etching stopper for use in removing the film to be etched.

The method of the ninth aspect can manufacture the stacked capacitor of the fifth aspect.

With the method of the tenth aspect, a sidewall conductive layer is tapered because it is formed by performing an etch back in the step (l). This enables to manufacture the stacked capacitor of the second aspect. It is also possible to make a slender lower electrode having on its surface a difficult-to-bury material, by employing as the first conductive layer a material easily buried in the pattern, and covering its surface with the sidewall conductive layer. This method is effective when it is desired to employ, as the electrode, a material that cannot be well deposited up to the bottom of the pattern by the existing technique.

With the method of the eleventh aspect, since the top protective film is formed by thermal oxidation, the manufacturing steps can be simplified than the case that the material for a top protective film is allowed to fill the part which is ensured by performing an over etching of the first conductive layer within the pattern.

The method of the twelfth aspect can manufacture the stacked capacitor of the third aspect.

The method of the thirteenth aspect can manufacture the stacked capacitor of the fourth aspect. In addition, it is possible to employ, as a first conductive layer, a material which will cause a chemical reaction with the sidewall conductive layer and be easily buried in the pattern. Even with a narrow-width pattern, the first conductive layer can be formed reliably.

With the method of the fourteenth aspect, the replacement metal is replaced with the top protective film. This enables to obtain a structure into which a top protective film having a sufficient film thickness is buried even if the material for the top protective film cannot be well deposited by the existing technique of CVD.

With the method of the fifteenth aspect, the top protective film is formed, and then heated and melted so that it flows into the top of the first conductive layer. This enables to obtain a structure into which a top protective film having a sufficient film thickness is buried even if the material for the top protective film cannot be well deposited by the existing technique of CVD.

With the method of the sixteenth aspect, a plating method is employed using the first portion of the top protective film as an electrode to further form the second portion of the top protective film. Therefore, it is possible to obtain a structure into which a top protective film having a sufficient film thickness is buried even if the material for the top protective film cannot be well deposited by the existing technique of CVD.

With the method of the seventeenth aspect, an etching of the top protective film is performed using a resist as a mask to remove a portion of the top protective film on the film to be etched which is not covered by the resist, and an etch back of a remaining portion of the top protective film is performed by a predetermined amount. This enables to remove a portion existing above the surface of the film to be etched for a short period of time, thereby reducing the film reduction amount of the top protective film. Consequently, the film thickness of the top protective film can be maintained thicker than in the case that an etch back of the top protective film formed on the top of the first conductive layer and the film to be etched is performed without using a resist.

With the method of the eighteenth aspect, a sidewall conductive layer is tapered because it is formed by performing an etch back in the step (l). This enables to manufacture the stacked capacitor of the third aspect. It is also possible to make a slender lower electrode having on its surface a difficult-to-bury material, by employing as the first conductive layer a material easily buried in the pattern, and covering its surface with the sidewall conductive layer. This method is effective when it is desired to employ, as the electrode, a material that cannot be well deposited up to the bottom of the pattern by the existing technique.

It is, accordingly, an object of the present invention to overcome the disadvantages in the prior art by providing a method of manufacturing a stacked capacitor with which it is easy to fabricate even when a noble metal, e.g., platinum, is used for a lower electrode, and providing a stacked capacitor that can suppress a chemical reaction between a dielectric film or a sidewall lower electrode and a conductive plug.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A first preferred embodiment is directed to realize a stacked capacitor that can suppress a chemical reaction between a dielectric film or a sidewall lower electrode and a conductive plug.

Figure 1:
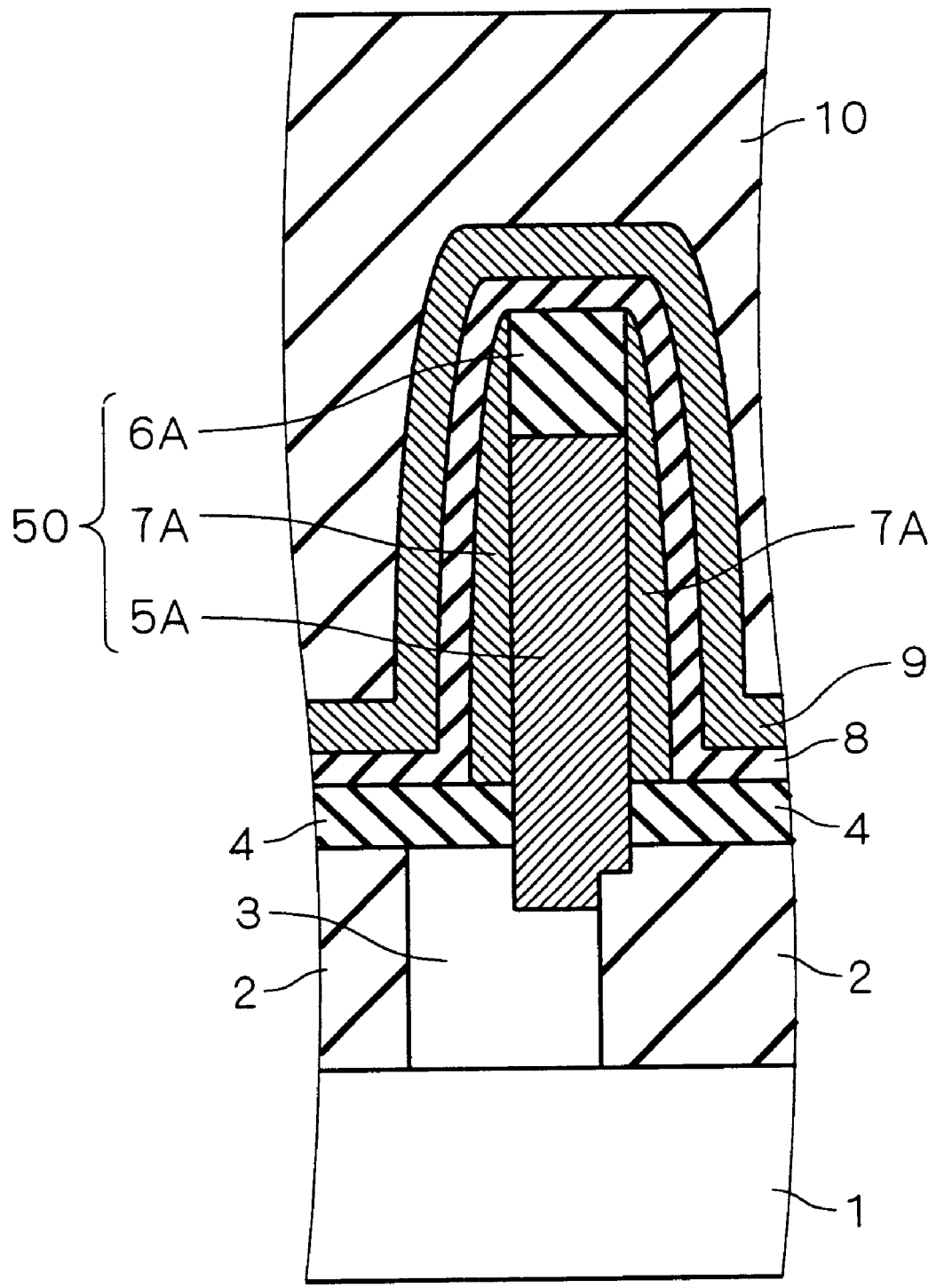
FIG. 1 is a cross section illustrating a stacked capacitor according to a first preferred embodiment of the present invention.

FIG. 1 is a cross section illustrating a stacked capacitor according to this embodiment. In FIG. 1, disposed on a semiconductor substrate 1 is a conductive plug 3 connected to the surface of the substrate 1. A transistor and an element isolation region comprising silicon oxide film, which are not shown, are disposed on the surface of the semiconductor substrate 1.

The conductive plug 3 extends through an interlayer insulating film 2. A surface-covering insulating film 4 is disposed so as to cover the surface of the conductive plug 3 and interlayer insulating film 2. A lower electrode core 5A, which is long in the height direction and has a barrier metal function, projects into the conductive plug 3 for connection while it extends vertically upwards from the conductive plug 3 and extends through the insulating film 4. Since the lower electrode core 5A projects into the conductive plug 3, the lower electrode core 5A is hard to tumble or displace in the course of manufacturing steps, as described later in a second preferred embodiment.

A top insulating film 6A is disposed on the top of the lower electrode core 5A, and a sidewall lower electrode 7A is disposed on the side surfaces of the lower electrode core 5A and top insulating film 6A. The lower electrode core 5A, top insulating film 6A and sidewall lower electrode 7A constitute a lower electrode 50.

The sidewall lower electrode 7A is disposed on the insulating film 4, and its width is reduced toward the upper part of the lower electrode 5A and top insulating film 6A. Specifically, the sidewall lower electrode 7A is tapered, and the lower electrode 50 is shaped so as to have a gentle edge.

With such a gentle edge of the electrode, it is hard to cause field concentration to the edge portion when the capacitor is operated. This permits an improvement in the reliability and durability of the capacitor.

A dielectric film 8 composed of a high-dielectric constant material is disposed so as to cover the lower electrode 50 and insulating film 4. An upper electrode 9 is disposed so as to cover the dielectric film 8. Thus, the foregoing components constitute the stacked capacitor.

An interlayer insulating film 10 is disposed so as to cover the upper electrode 9. Aluminum wiring (not shown) is disposed above an upper portion of the capacitor in the interlayer insulating film 10.

For instance, a high-dielectric constant material, e.g., BST, is used for the dielectric film 8, a noble metal, e.g., platinum is used for the sidewall lower electrode 7A and upper electrode 9, titanium nitride is used for the lower electrode core 5A, a silicon oxide film is used for the interlayer insulating films 2 and 10, and polycrystalline silicon is used for the conductive plug 3.

The top insulating film 6A is formed of an insulating film that suppresses the mutual diffusion of the elements constituting the lower electrode core 5A and the elements constituting the dielectric film 8. The insulating film 4 is formed of an insulating film that suppresses the mutual diffusion of the elements constituting the sidewall lower electrode 7A and the elements constituting the conductive plug 3.

As exemplified above, when BST for the dielectric film 8, platinum for the sidewall lower electrode 7A, titanium nitride for the lower electrode core 5A, and polycrystalline silicon for the conductive plug 3 are respectively employed, for example, silicon nitride is used for both top insulating film 6A and insulating film 4. The top insulating film 6A composed of silicon nitride suppresses the oxygen penetration from the dielectric film 8 to the lower electrode core 5A. The insulating film 4 suppresses the silicidation between the sidewall lower electrode 7A and conductive plug 3, and also suppresses the oxygen penetration from dielectric film 8 to the conductive plug 3.

By the presence of the sidewall lower electrode 7A, there is no possibility that the lower electrode core 5A makes a direct contact with the dielectric film 8. Thereby, a material that will cause a chemical reaction with the dielectric film 8 can be used for the lower electrode core 5A.

Referring to FIG. 1, there is shown the state that, due to low mask alignment accuracy, the lower electrode core 5A does not fall within the diameter range of the conductive plug 3, thereby slightly jutting out from the conductive plug 3. Here, it is considered that the top surface of the conductive plug 3 is not completely covered with the lower electrode core 5A, as in the case that the lower electrode core 5A juts out from the conducive plug 3, alternatively, the diameter of the lower electrode core 5A is smaller than that of the conductive plug 3, thus falling within its diameter range. If the lower electrode core 5A projects into a part of the conducive plug 3, the contact area between the lower electrode core 5A and conductive plug 3 is increased by the amount of the side surface corresponding to the portion projected into the conductive plug, as compared to the case of having no projection into the plug. Thereby, the resistance between the lower electrode core 5A and conductive plug 3 is lowered.

On the other hand, if the top surface of the conductive plug 3 is completely covered with the lower electrode core 5A, it makes no difference in the resistance between the lower electrode core 5A and conductive plug 3, whether the former projects into the latter. However, the projection gives an effect that the lower electrode core 5A is hard to tumble or displace during the manufacturing steps.

With the stacked capacitor of the first preferred embodiment, by the presence of the insulating film 4, a chemical reaction between the conductive plug 3 and sidewall lower electrode 7A or dielectric film 8 can be suppressed at low mask alignment accuracy, when the diameter of the conductive plug 3 is increased, alternatively, the diameter of the conductive plug 3 becomes relatively large. A chemical reaction between the lower electrode core 5A and dielectric film 8 is suppressed by the presence of the top insulating film 6A. Further, a chemical reaction between the lower electrode core 5A as a barrier metal, and the dielectric film 8 is suppressed by the presence of the sidewall lower electrode 7A.

Since the lower electrode core 5A is projected into a part of the conductive plug 3, the lower electrode core 5A is hard to tumble or displace during the manufacturing steps. When the top surface of the conductive plug 3 is not completely covered with the lower electrode core 5A, the contact area between the lower electrode core 5A and conductive plug 3 is increased by the amount of the side surface corresponding to the portion projected into the conductive plug. This permits a reduction in the resistance between the lower electrode core 5A and conductive plug 3

Second Preferred Embodiment

A second preferred embodiment concerns a method of manufacturing a stacked capacitor according to the first preferred embodiment. FIGS. 2 to 14 are cross sections illustrating a sequence of steps in a method of manufacturing a stacked capacitor, according to the second preferred embodiment.

Figure 2:
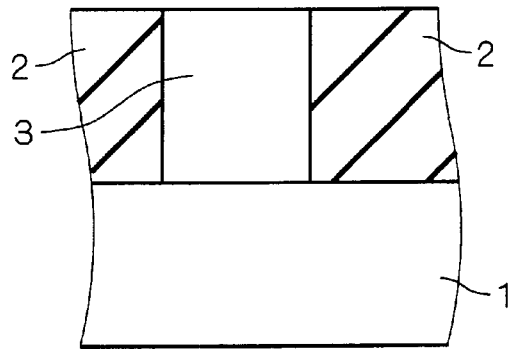
FIGS. 2 to 14 are cross sections illustrating a sequence of steps in a method of manufacturing a stacked capacitor according to a second preferred embodiment.

Referring to FIG. 2, on the surface of a semiconductor substrate 1, an element isolation region, active region, and elements such as a transistor are formed as in the prior art, although the structure of the surface of the semiconductor substrate 1 is not shown. Then, by CVD method or the like, an interlayer insulating film 2 is formed on the semiconductor substrate 1, and a contact hole is formed which makes connection with the active region and the element on the surface of the semiconductor substrate 1. A conductive material such as a doped polycrystalline silicone is deposited over the interlayer insulating film 2 so as to bury the contact hole, by means of CVD method or the like. Subsequently, the conductive material on the interlayer insulating film 2 is removed by means of CMP (chemical mechanical polishing) or the like, thereby forming a conductive plug 3 within the contact hole.

Figure 3:
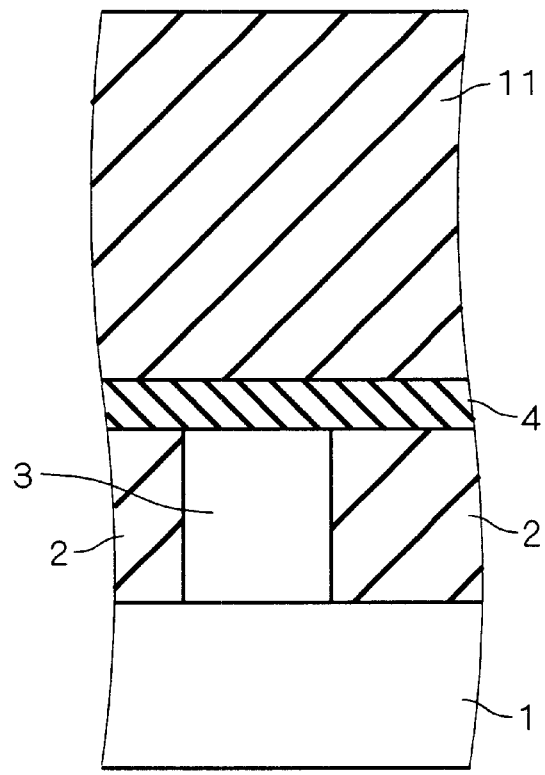

Referring to FIG. 3, an insulating film 4 is formed on the interlayer insulating film 2 and conductive plug 3. Then, a film to be etched 11 is formed which serves as a mold for a lower electrode core 5A in the subsequent step. For instance, a silicon oxide film is suitably used for the film to be etched 11. The insulating film 4 has a thickness of 30 nm to 100 nm, and the film to be etched 11 has a thickness of about 300 nm to 600 nm.

Figure 4:
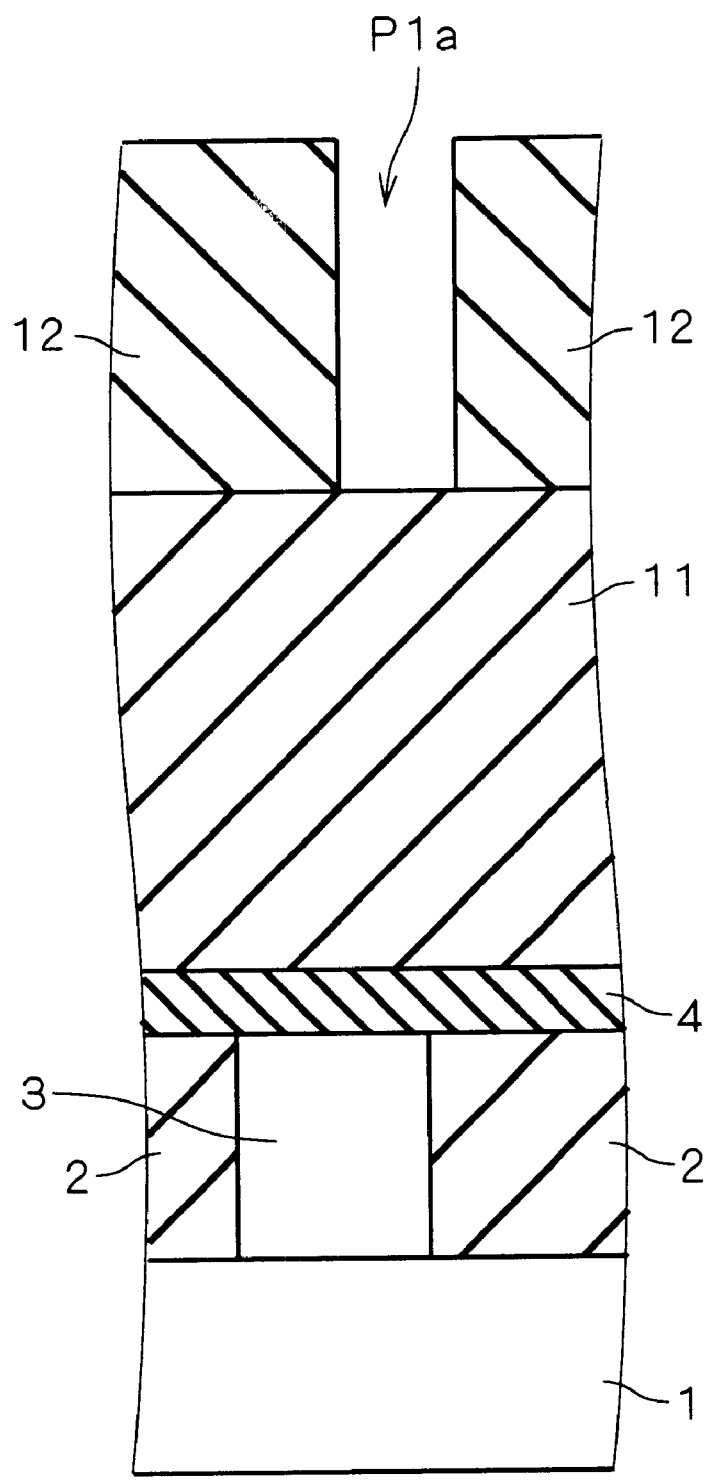

Referring to FIG. 4, a resist 12 is formed on the film to be etched 11, and a pattern P1*a* for the lower electrode core 5A is formed in the resist 12. The width of the pattern P1*a* is preferably from 100 nm to 200 nm.

Figure 5:
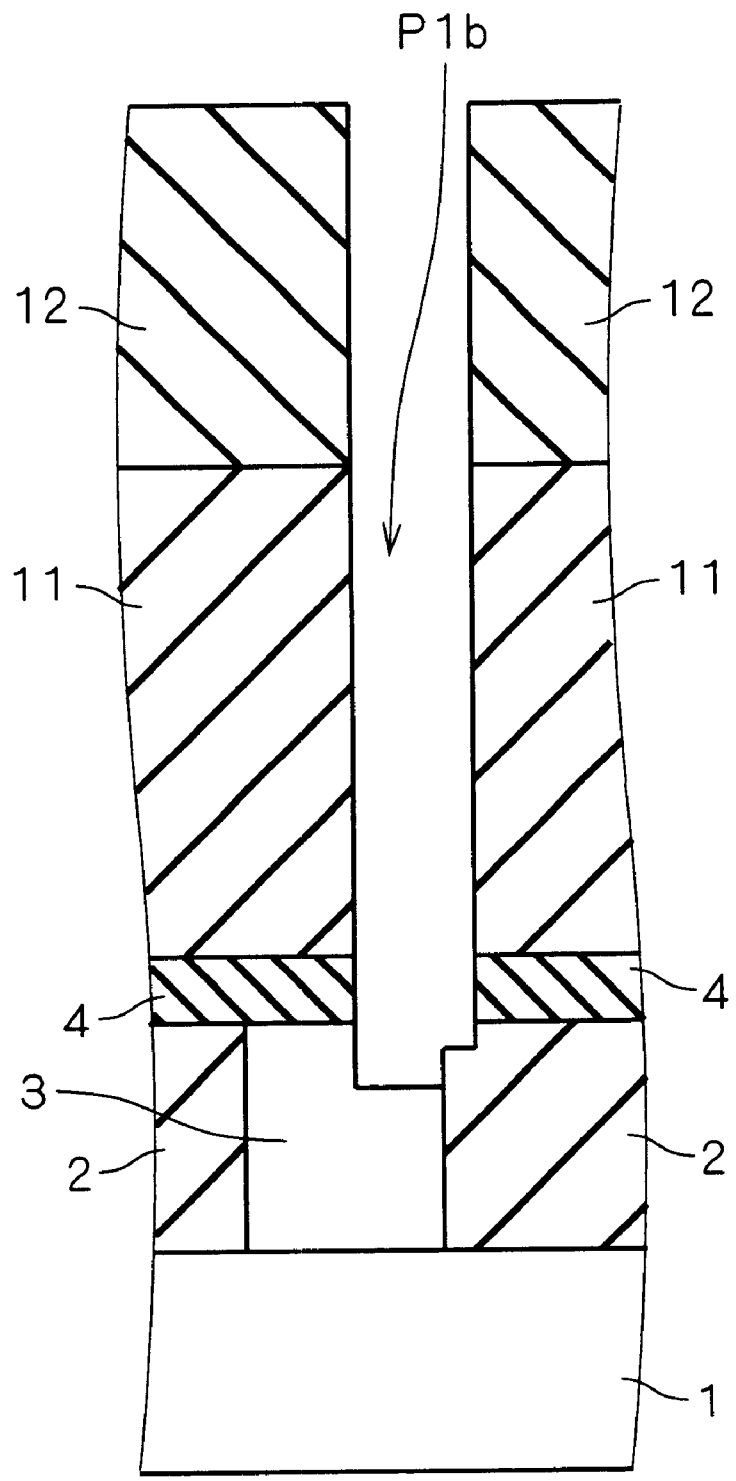

Referring to FIG. 5, by using the resist 12 as a mask, the film to be etched 11, insulating film 4 and a part of conducive plug 3 are etched to form a pattern P1*b* for the lower electrode core 5A, so that the pattern P1*b* projects into the conductive plug 3 while it extends vertically upwards from the conductive plug 3 and extends through the insulating film 4 and the film to be etched 11.

Figure 6:
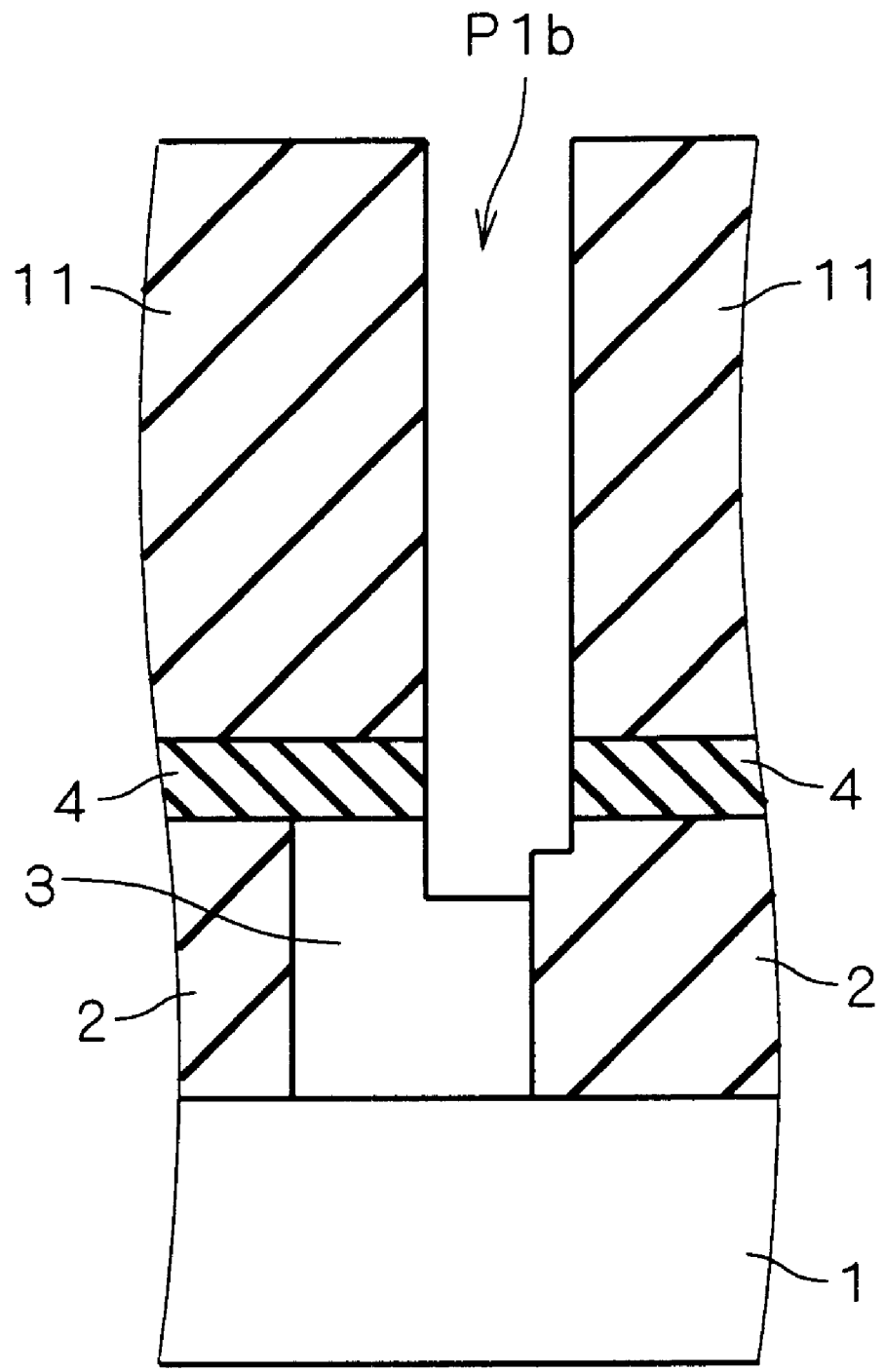

Referring to FIG. 6, the resist 12 is removed by plasma ashing or the like.

Figure 7:
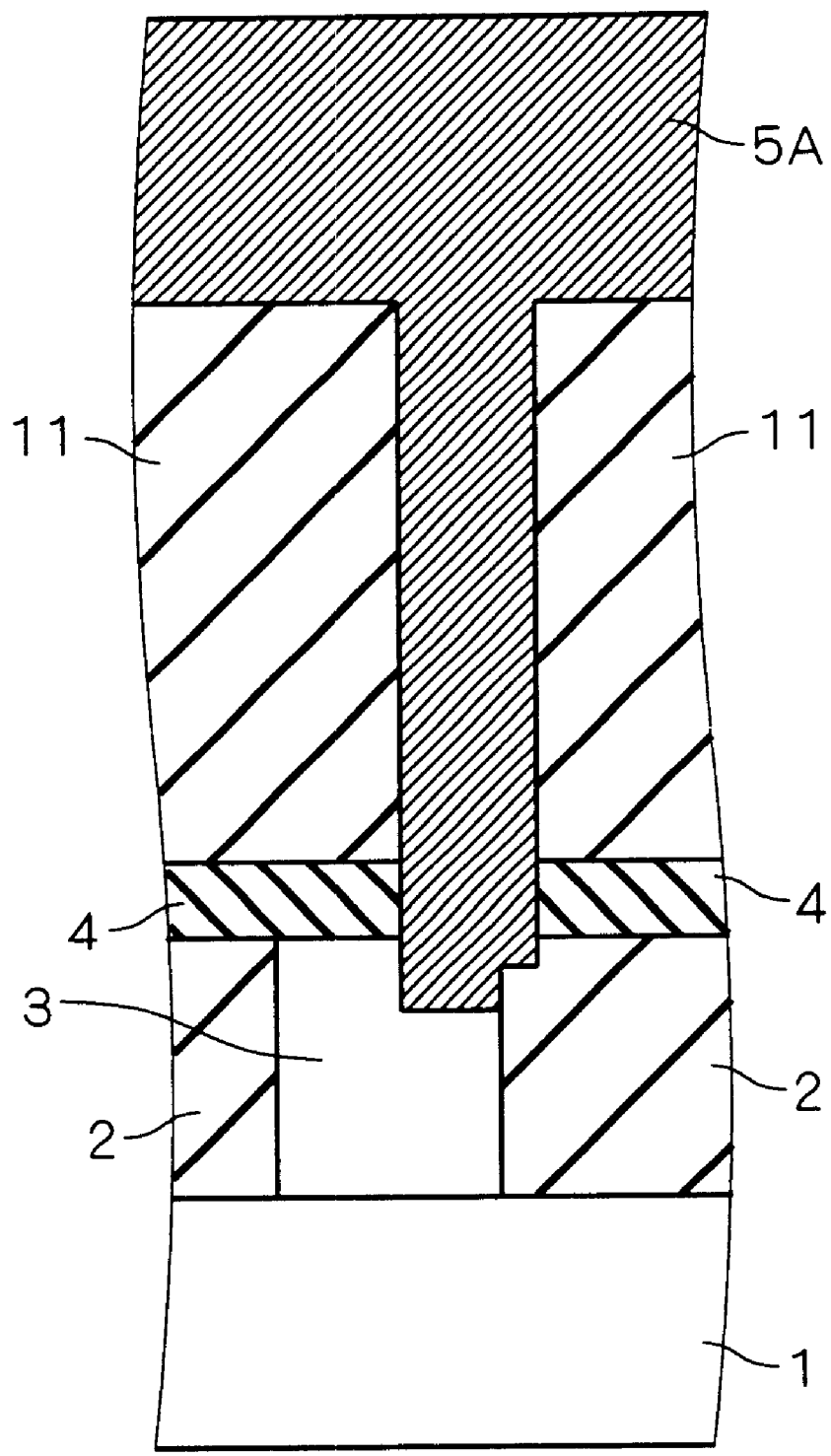

Referring to FIG. 7, a material for the lower electrode core 5A is deposited over the film to be etched 11 so as to fully bury the pattern P1*b*. When titanium nitride is used for the material for the lower electrode core 5A, it is preferable to deposit in a thickness of about 100 nm by means of CVD, at a deposition temperature of 600° C., and by using titanium tetrachloride and ammonia as a source gas.

Figure 8:
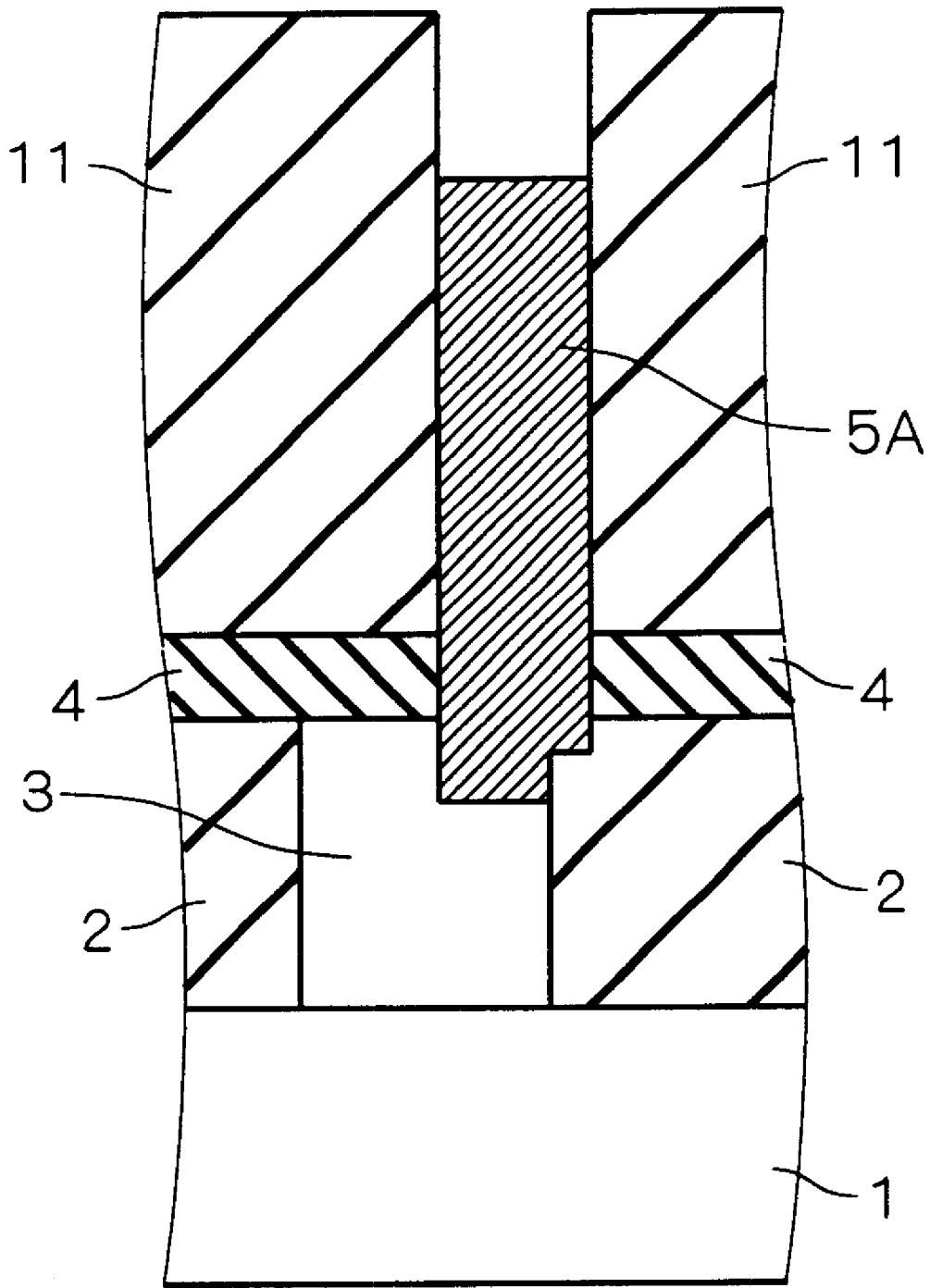

Referring to FIG. 8, the material for the lower electrode core 5A existing on the film to be etched 11 is removed. At this time, the material for the lower electrode core 5A is subjected to a slightly over etching, such that the top of the lower electrode core 5A is lower than the surface of the film to be etched 11. When titanium nitride is used for the lower electrode core 5A, and a silicon oxide film is used for the film to be etched 11, it is preferable to perform a plasma etching by using chlorine gas as an etching gas. This allows for etching of the material for the lower electrode core 5A while leaving the film to be etched 11.

Figure 9:
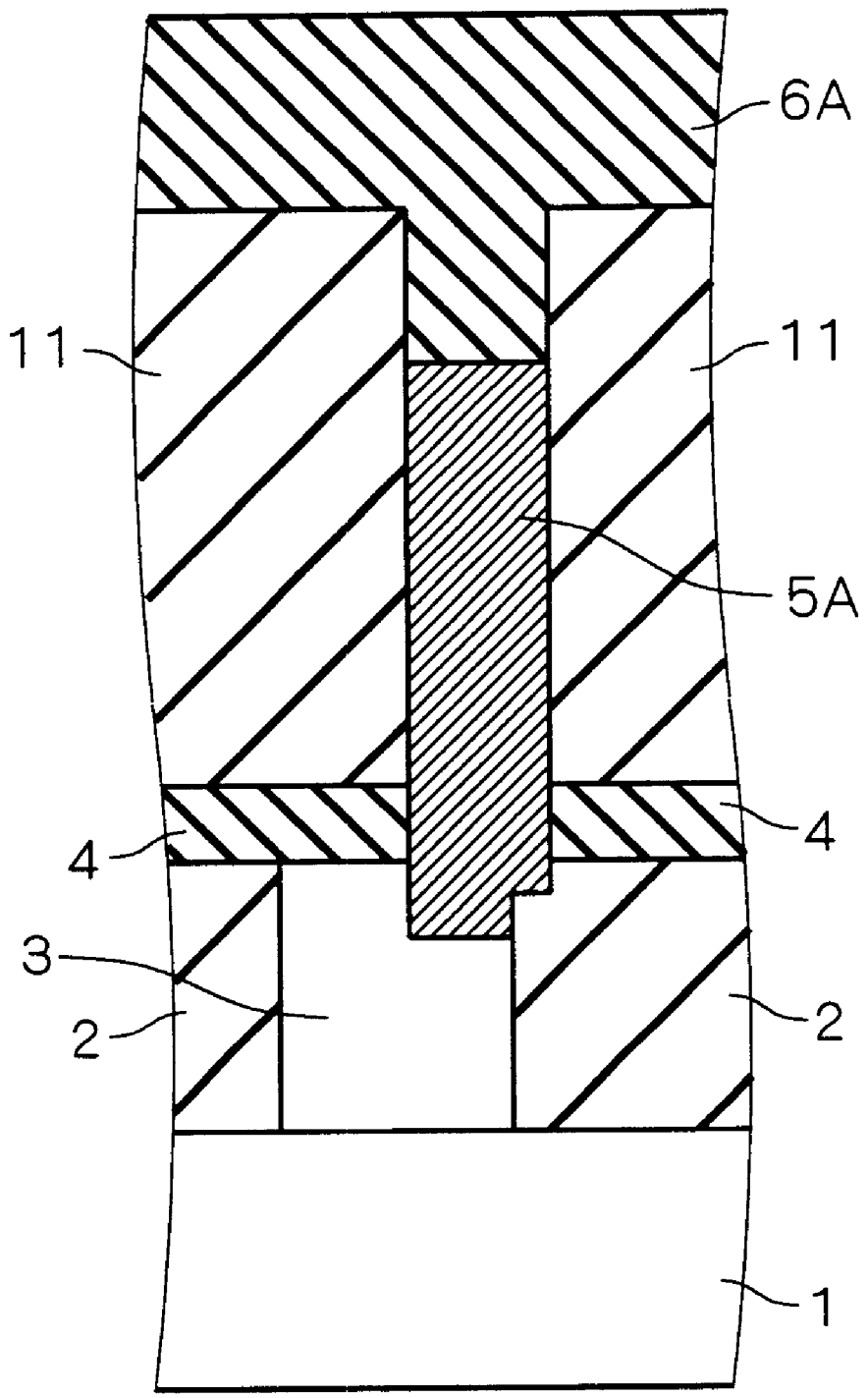

Referring to FIG. 9, a material for a top insulating film 6A is deposited over the film to be etched 11. When a silicon nitride film is employed as the material for the top insulating film 6A, it is preferable to deposit in a thickness of about 100 nm by means of CVD, at a deposition temperature of 700° C., and by using dichlorosilane and ammonia as a source gas.

Figure 10:
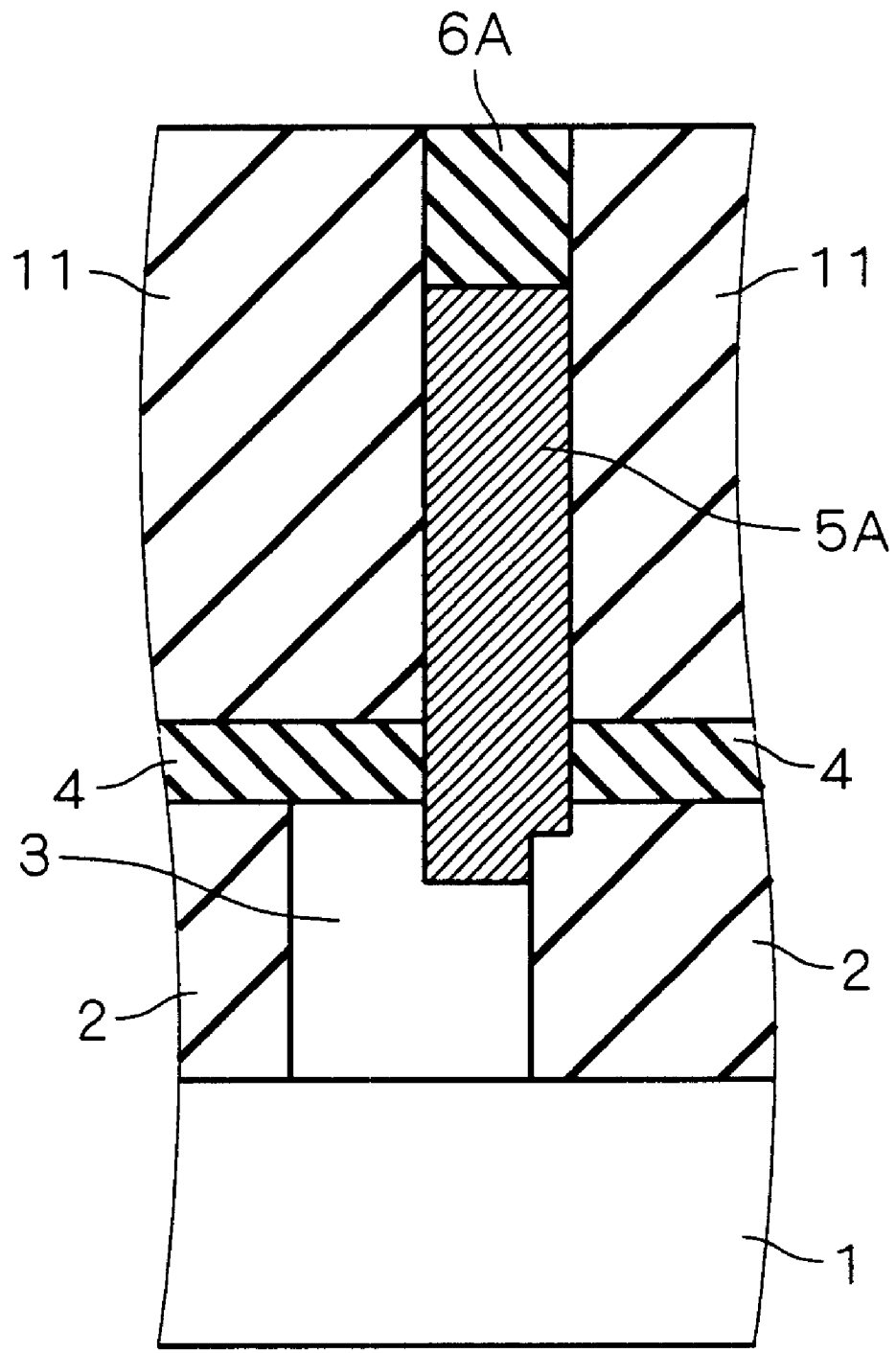

Referring to FIG. 10, by means of CMP or the like, the material for the top insulating film 6A existing on the film to be etched 11 is removed while leaving that material on the top of the lower electrode core 5A. Thereby, the top insulating film 6A is provided on the top of the lower electrode core 5A.

Meanwhile, when a silicon nitride film is used for the top insulating film 6A, and a silicon oxide film is used for the film to be etched 11, the point of time at which polishing is terminated can be detected because these materials have different polishing rates in CMP method. But it should be noted that if the polishing rate of the silicon oxide film is higher than that of the silicon nitride film, upon completion of the polishing of the material for the top insulating film 6A existing on the film to be etched 11, the polishing of the film to be etched 11 is started while leaving the top insulating film 6A. This situation can be avoided by taking the following manner. That is, the polishing by CMP method is stopped before the material for the top insulating film 6A remaining on the film to be etched 11 is completely removed. Thereafter, a dry etching is performed and its duration is controlled to remove the material for the top insulating film 6A remaining on the film to be etched 11.

Figure 11:
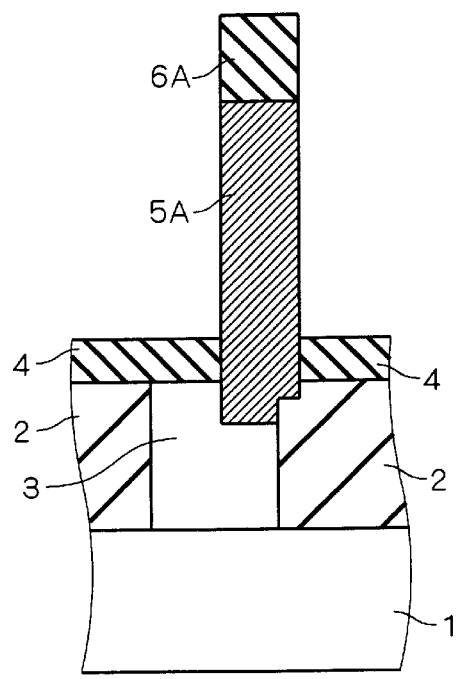

Referring now to FIG. 11, the film to be etched 11 is removed. If only a material having etching selectivity against the film to be etched 11 is used for the insulating film 4, lower electrode core 5A and top insulating film 6A, it is possible to remove the film to be etched 11 while leaving the insulating film 4, lower electrode core 5A and top insulating film 6A. By allowing the insulating film 4 to function as an etching stopper, the interlayer insulating film 2 can be left even when the same material is used for the film to be etched 11 and interlayer insulating film 2. For instance, when a silicon oxide film for the film to be etched 11, titanium nitride for the lower electrode core 5A, and a silicon nitride film for the insulating film 4 and top insulating film 6 are respectively employed, it is possible to remove only the film to be etched 11 while leaving the lower electrode core 5A, top insulating film 6A and insulating film 4, by performing a wet etching using hydrofluoric acid.

Hereat, the lower electrode core 5A is hard to tumble during the removal of the film to be etched 11, because the core 5A projects into the conductive plug 3 while it extends vertically upwards from the conductive plug 3 and extends through the insulating film 4.

Figure 12:
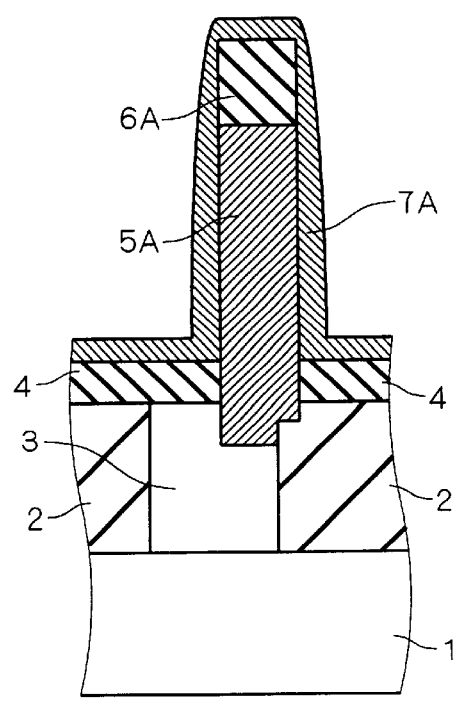

Referring to FIG. 12, a material for a sidewall lower electrode 7A is deposited so as to cover the lower electrode core 5A, top insulating film 6A and insulating film 4. When a noble metal, e.g., platinum, is used for the sidewall lower electrode 7A, deposition by means of sputtering is suitable. For instance, the material for the sidewall lower electrode 7A is deposited so that it has a thickness of about 30 nm at the flat portion on the insulating film 4.

Figure 13:
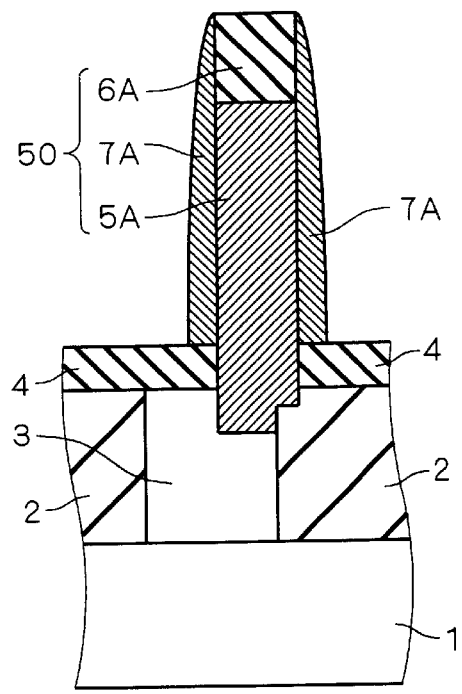

Referring to FIG. 13, an etch back of the material for the sidewall lower electrode 7A is performed to provide the sidewall lower electrode 7A on the side surfaces of the lower electrode core 5A and top insulating film 6A. This etch back enables removing of the material for the sidewall lower electrode 7A that exists on the insulating film 4 and top insulating film 6A. Also, due to this etch back, the sidewall lower electrode 7A is tapered along the lower electrode 5A and top insulating film 6A. Specifically, the lower electrode 50 has a gentle edge. It is therefore possible to manufacture a stacked capacitor with excellent reliability and durability, since it is hard to cause field concentration at the time of operation.

Figure 14:
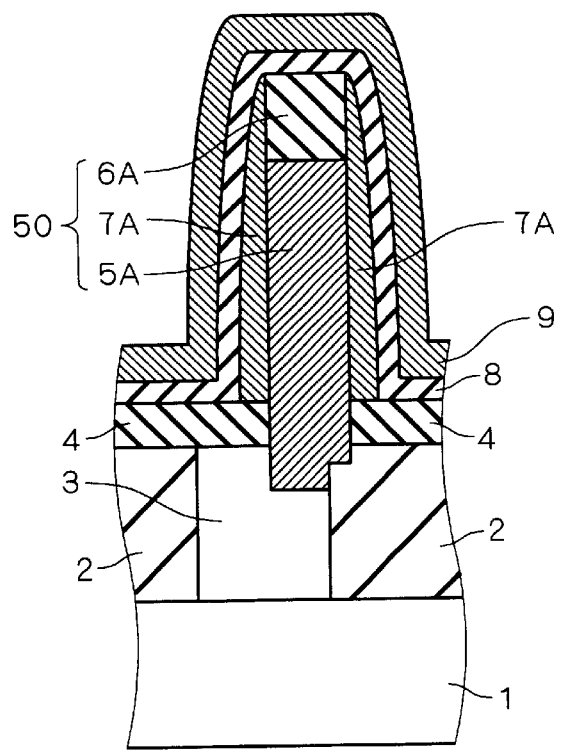

Referring to FIG. 14, a dielectric film 8 and upper electrode 9 are formed in the order named. For instance, when a high dielectric constant material such as BST is used for the dielectric film 8, and a noble metal such as platinum is used for the upper electrode 9, both can be formed by sputtering. Of course, CVD may be employed.

In order to avoid insufficient coverage on the side surfaces of the lower electrode 50, the dielectric film 8 is preferably formed so that it has a thickness of about 80 nm at the flat portion on the insulating film 4. This is true for the upper electrode 9.

Subsequently, as in the prior art, an interlayer insulating film 10 is formed on the upper electrode 9, and aluminum wiring (not shown) is formed, resulting in such a stacked capacitor as described in the first preferred embodiment.

The method of manufacturing a stacked capacitor according to the second preferred embodiment provides the stacked capacitor of the first preferred embodiment. Since the lower electrode core 5A is formed by using the film to be etched 11 as a mold, the width and height of the lower electrode core 5A can be controlled by selecting a material which is easy to fabricate and has a large thickness, as the material for the film to be etched 11, and adjusting the thickness and patterning width of the film to be etched 11. This enables to manufacture a minute stacked capacitor having a high lower electrode. The slender lower electrode core 5A is hard to tumble when the film to be etched 11 is removed, because the lower electrode core 5A projects into the conductive plug 3 while it extends vertically upwards from the conductive plug 3 and extends through the insulating film 4.

Although a noble metal such as platinum is usable as the lower electrode core 5A, some noble metal (e.g., platinum) cannot be well deposited up to the bottom of the pattern P1*b* by the existing technique such as CVD method. Therefore, the method of manufacturing a stacked capacitor of the second preferred embodiment is useful with the case that such a noble metal is employed as an electrode. Specifically, a slender lower electrode which has on its surface a difficult-to-bury noble metal, e.g., platinum, can be made by employing a material easily buried in the pattern P1b, as the lower electrode core 5A, and covering the surface of the core 5A with the sidewall lower electrode 7A.

Third Preferred Embodiment

Figure 15:
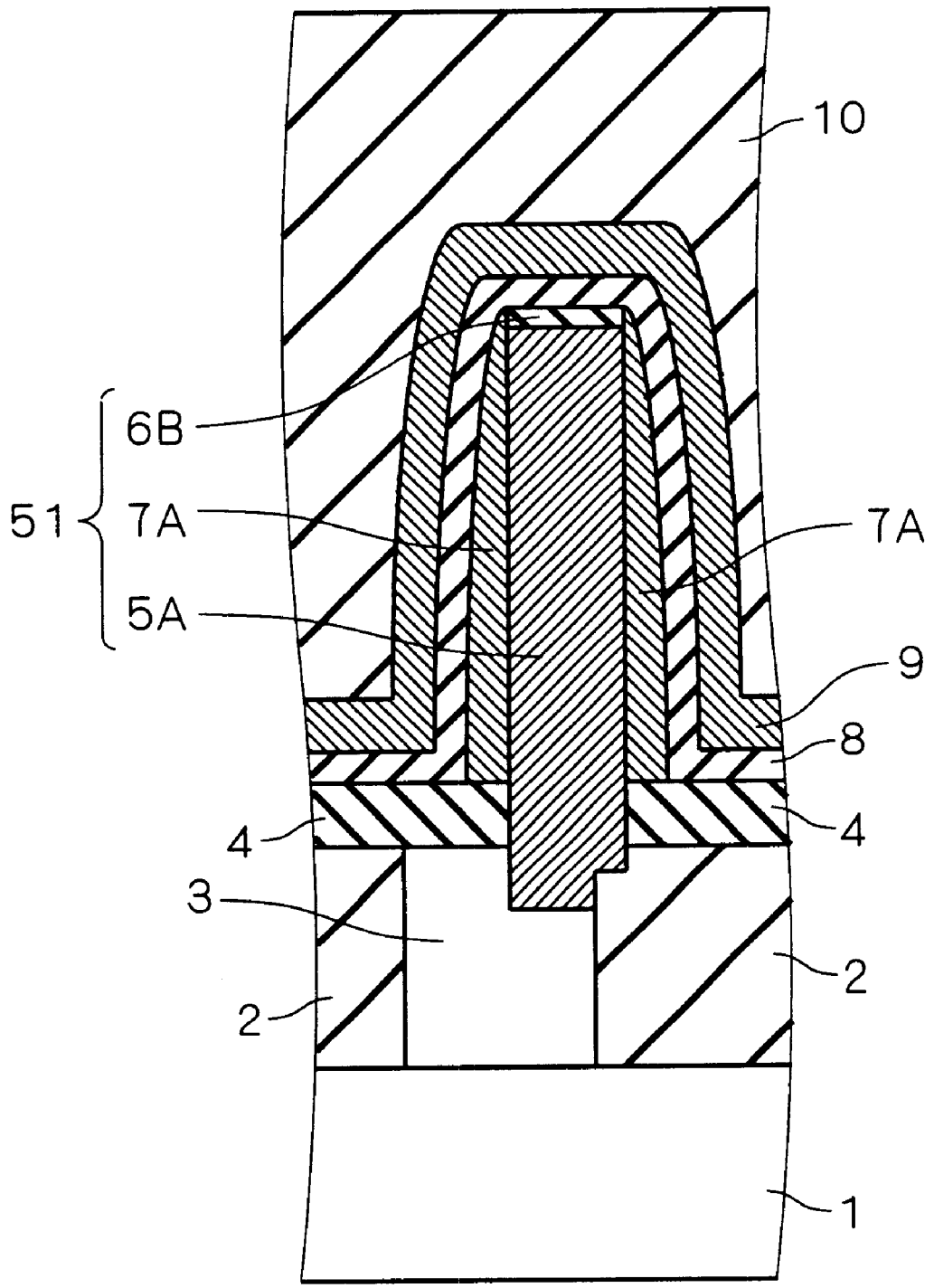
FIG. 15 is a cross section illustrating a stacked capacitor manufactured by a method according to a third preferred embodiment.

A third preferred embodiment concerns a modification of the method of manufacturing a stacked capacitor in the second preferred embodiment. This embodiment differs from the second preferred embodiment in that a lower electrode 51 comprises a top insulating film 6B, in place of the top insulating film 6A of the lower electrode 50. FIG. 15 shows a stacked capacitor provided with the top insulating film 6B.

The top insulating film 6A of the second preferred embodiment is made in the manner that an insulating film is formed on the film to be etched 11 by CVD method or the like, and the insulating film is left only on the top of the lower electrode core 5A within the pattern P1b. In the third preferred embodiment, after the step of FIG. 7, no over etching is performed when removing the material for the lower electrode core 5A existing on the film to be etched 11. Instead of this, the lower electrode core 5A is formed so as to fill the pattern P1b. Subsequently, the top of the lower electrode core 5A is insulated by thermal oxidation, thereby forming a top insulating film 6B.

For instance, when titanium nitride is used for the material for the lower electrode core 5A, it is preferable to oxide the titanium nitride by heating at a temperature of 550° C., in an atmosphere of oxygen, and for 30 minutes.

With the method of manufacturing a stacked capacitor according to the third preferred embodiment, the step of depositing the material for the top insulating film 6A and the step of removing the material for the top insulating film 6A existing on the film to be etched 11 are not required which are needed in the second preferred embodiment. Instead of these, there is required only the step of performing thermal oxidation to the surface of the lower electrode 5A. This enables to simplify the process of manufacturing a stacked capacitor according to the first preferred embodiment.

Fourth Preferred Embodiment

Figure 16:
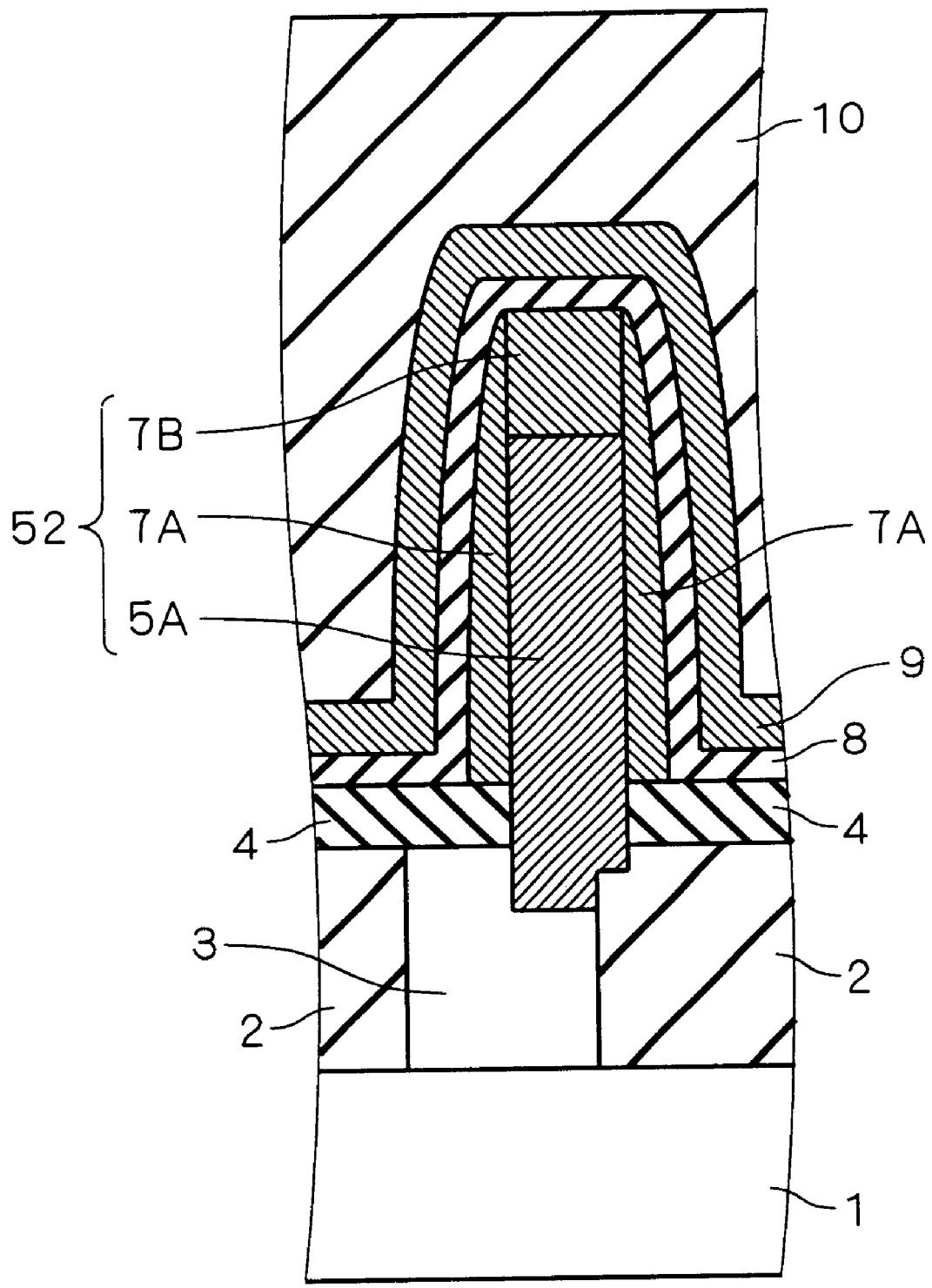
FIG. 16 is a cross section illustrating a stacked capacitor according to a fourth preferred embodiment.

A fourth preferred embodiment concerns a modification of the stacked capacitor in the first preferred embodiment. This embodiment differs from the first preferred embodiment in that a lower electrode 52 comprises a top conductive film 7B, in place of the top insulating film 6A of the lower electrode 50 in the first preferred embodiment. FIG. 16 shows a stacked capacitor provided with the top conductive film 7B. A noble metal such as platinum is preferably used for the top conductive film 7B, as in the sidewall lower electrode 7A.

A method of manufacturing a stacked capacitor according to the fourth preferred embodiment is attainable by modifying the method of the second preferred embodiment. That is, in the step shown in FIG. 9, without depositing the material for the top insulating film 6A on the film to be etched 11, a material for a top conductive film 7B comprising a noble metal such as platinum, instead of the material for the top insulating film 6A, is deposited by sputtering or the like.

With the stacked capacitor of the fourth preferred embodiment, the top of the lower electrode core 5A is covered with the top conductive film 7B composed of a noble metal, e.g., platinum. Therefore, as compared with the stacked capacitor of the first preferred embodiment, the area of conductive portions of the lower electrode connected to a dielectric film 8 is increased, thereby increasing electrostatic capacity.

Fifth Preferred Embodiment

Figure 17:
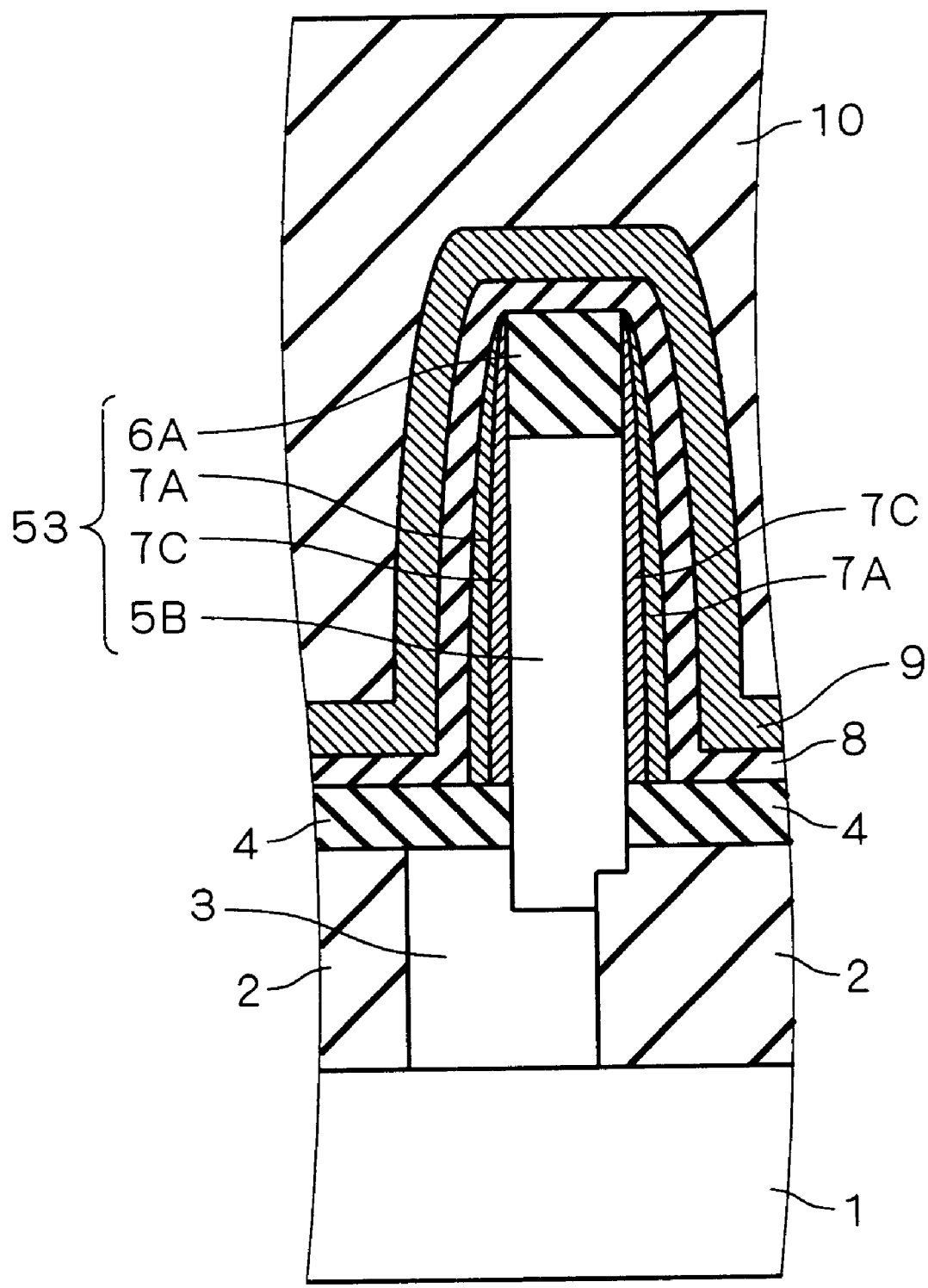
FIG. 17 is a cross section illustrating a stacked capacitor according to a fifth preferred embodiment.

A fifth preferred embodiment concerns a modification of the stacked capacitor of the first preferred embodiment. Specifically, a lower electrode 53 is characterized in that a lower electrode core 5B composed of a material which is susceptible to a chemical reaction with a sidewall lower electrode 7A is employed in place of the lower electrode core 5A of the lower electrode 50 in the first preferred embodiment, and that a barrier metal 7C is disposed between the sidewall lower electrode 7A and lower electrode core 5B. FIG. 17 shows a stacked capacitor provided with the lower electrode core 5B and barrier metal 7C. For instance, polycrystalline silicon is preferably used for the lower electrode core 5B, as in a conductive plug 3. Titanium nitride is preferably used for the barrier metal 7C.

A method of manufacturing a stacked capacitor according to the fifth preferred embodiment is attainable by modifying the method of the second preferred embodiment. That is, in the step of FIG. 7, in place of the material for the lower electrode core 5A, a material for the lower electrode core 5B, e.g., polycrystalline silicon, which is similar to the material for the conductive plug 3, is deposited over a film to be etched 11 so as to bury a pattern P1b. Subsequently, in the same manner as shown in FIG. 8, the material for the lower electrode core 5B is subjected to a slightly over etching, followed by the steps shown in FIGS. 9 to 11. Thereafter, in place of the material for the sidewall lower electrode 7A in FIGS. 12 and 13, a material for a barrier metal 7C, e.g., titanium nitride, is deposited by sputtering or the like. An etch back is then performed, followed by the steps shown in FIGS. 12 to 14. This results in the stacked capacitor according to the fifth preferred embodiment.

With this stacked capacitor, even when a material that is susceptible to a chemical reaction with the sidewall lower electrode 7A is used for the lower electrode core 5B, the chemical reaction therebetween can be suppressed by the presence of the barrier metal 7C.

In addition, the method of manufacturing a stacked capacitor according to the fifth preferred embodiment has the advantages that the lower electrode core 5B can be formed of a material (e.g., polycrystalline silicon) which is susceptible to a chemical reaction with the sidewall lower electrode 7A, and is easily buried in the pattern P1b, and that the lower electrode core 5B can be formed reliably even when the pattern P1b has a narrow width.

Sixth Preferred Embodiment

Figure 18:
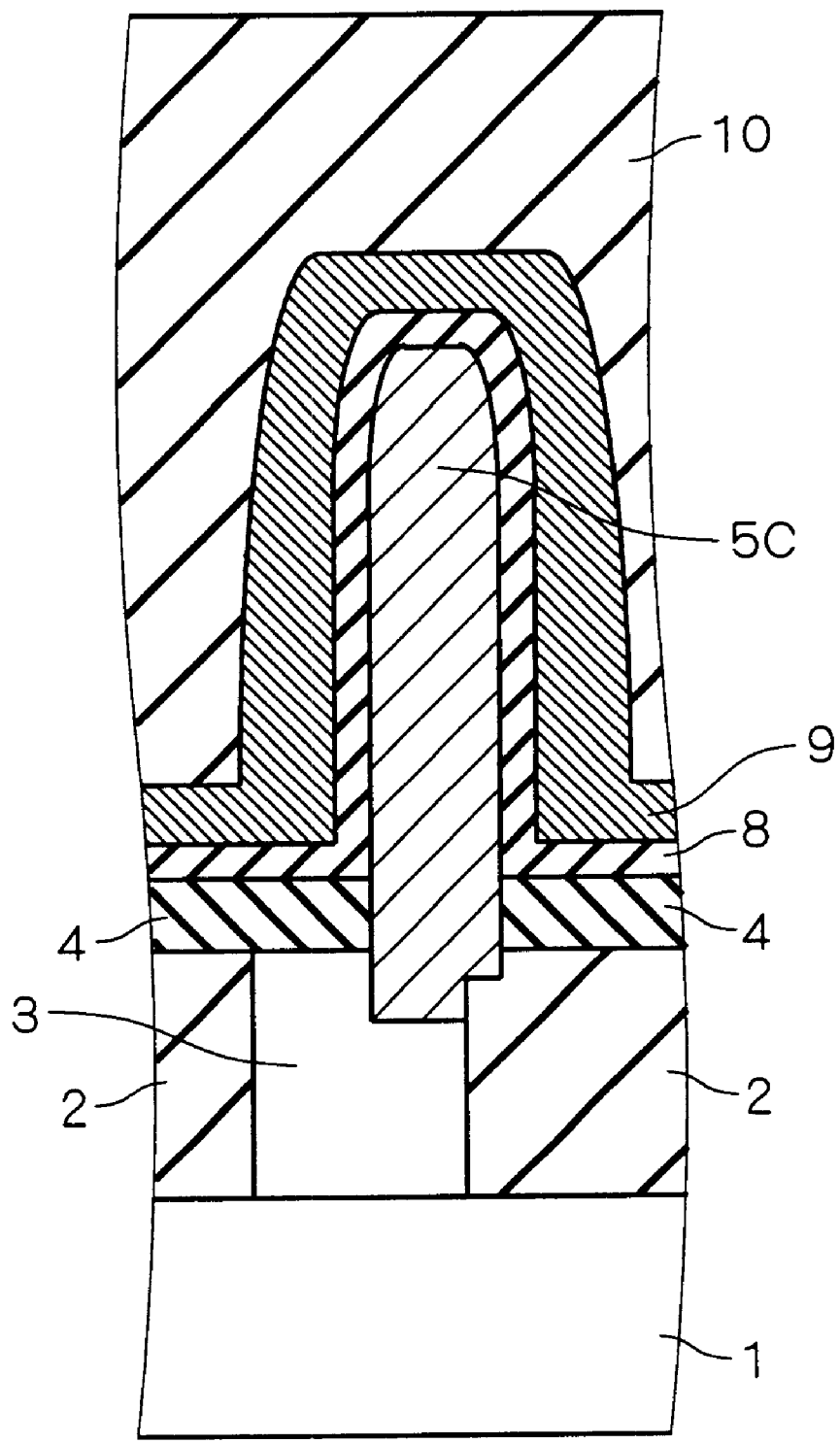
FIG. 18 is a cross section illustrating a stacked capacitor according to a sixth preferred embodiment.
Figure 19:
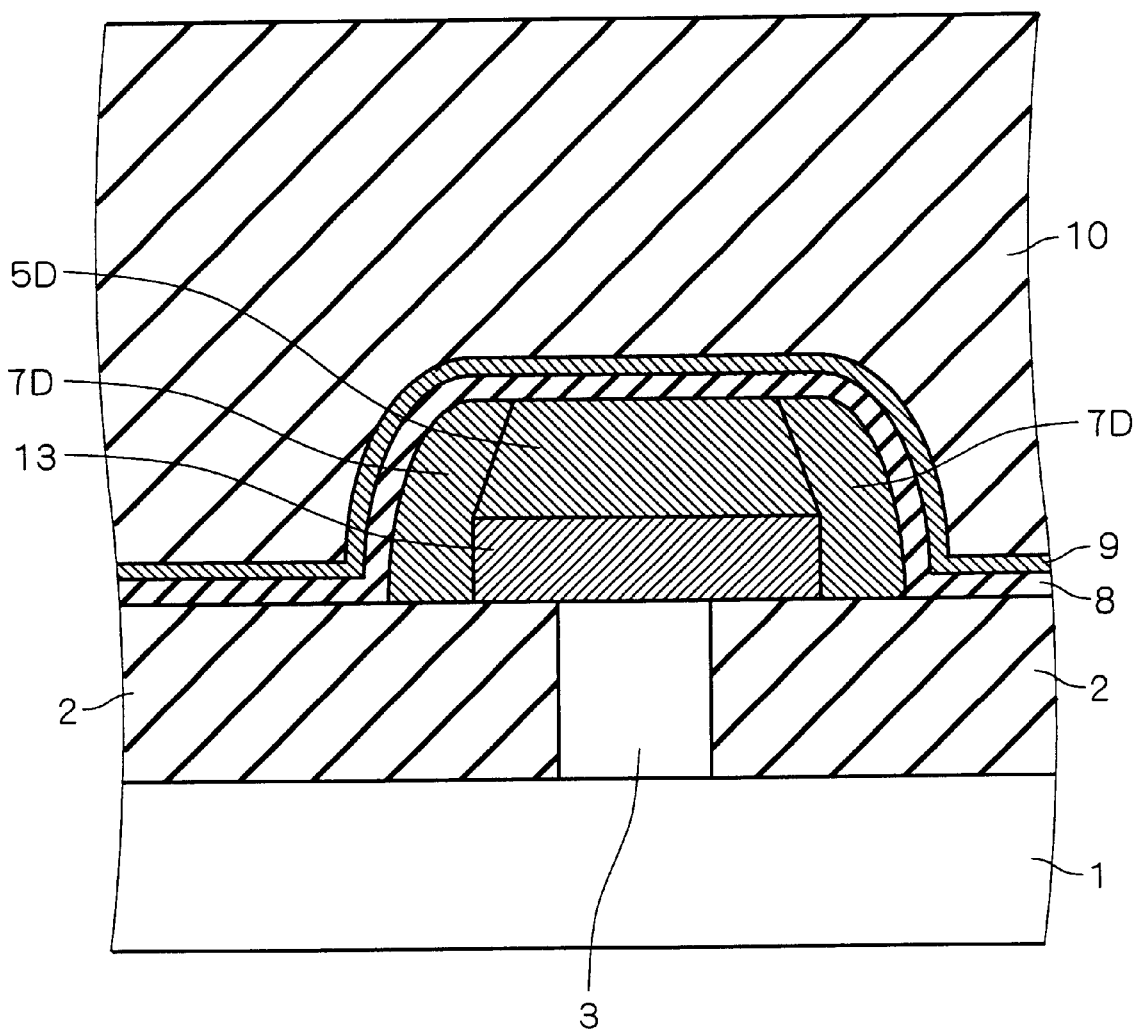
FIG. 19 is a cross section of a conventional stacked capacitor.
Figure 20:
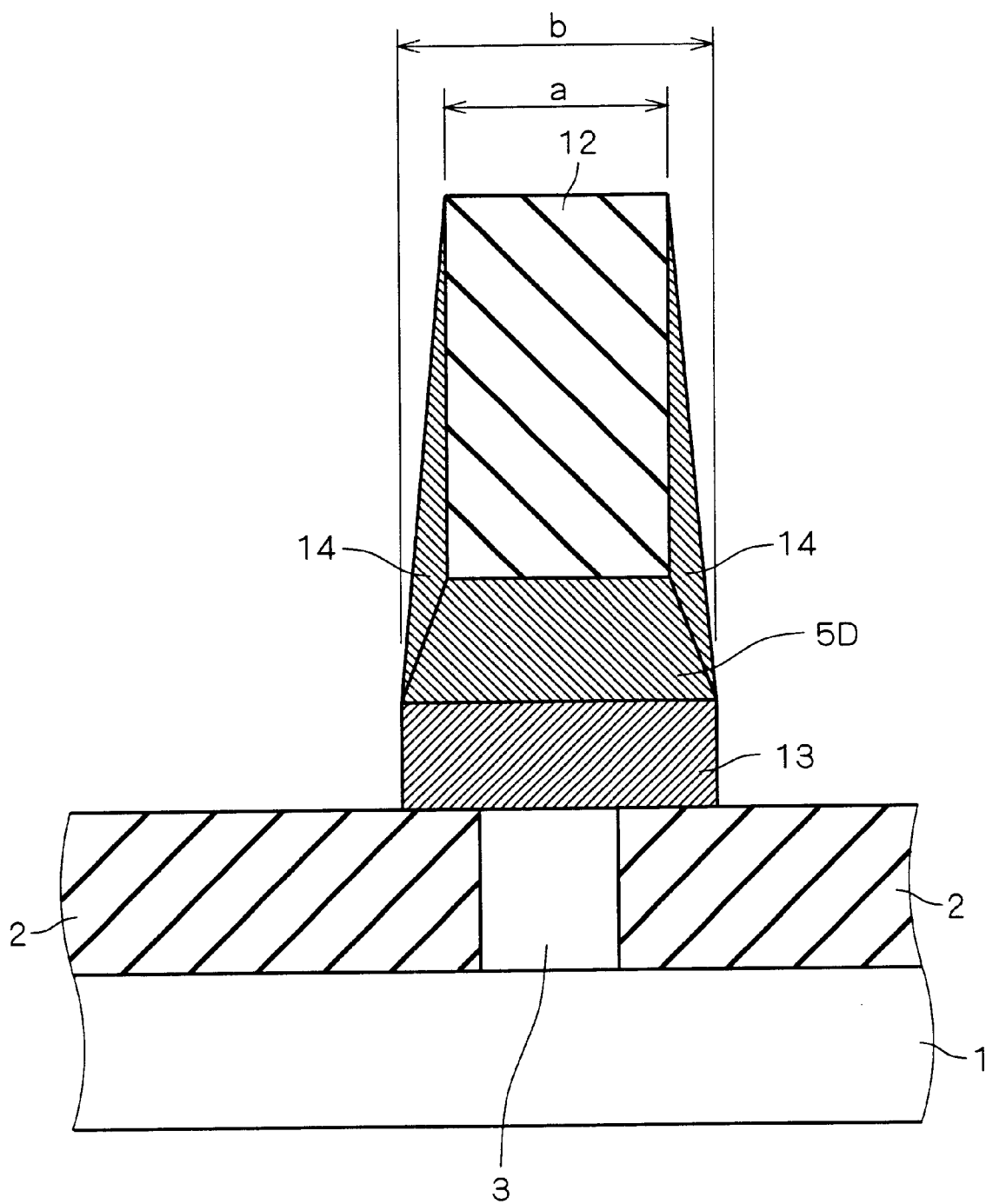
FIG. 20 is a cross section illustrating a step in a conventional method of manufacturing a stacked capacitor.

A sixth preferred embodiment concerns a modification of the stacked capacitor of the first preferred embodiment. Specifically, a lower electrode 5C is disposed in place of the lower electrode 50 of the first preferred embodiment. FIG. 18 shows a stacked capacitor provided with the lower electrode 5C. Suitable material for the lower electrode 5C is a noble metal that is relatively easy to bury, such as ruthenium, rhodium, palladium, osmium or iridium.

A method of manufacturing a stacked capacitor according to the sixth preferred embodiment is attainable by modifying the method of the second preferred embodiment. That is, in the step of FIG. 7, in place of the material for the lower electrode core 5A, a material for the lower electrode core 5C, which is relatively easy to bury (e.g., ruthenium), is deposited over a film to be etched 11 so as to bury a pattern P1b. Subsequently, the material for the lower electrode 5C existing on the film to be etched 11 is removed. At this time, without performing any over etching, the lower electrode 5C is formed so as to fill the pattern P1b. The step of forming a top insulating film 6A shown in FIGS. 9 and 10 is skipped, and the film to be etched 11 is removed as shown in FIG. 11.

Subsequently, by using Ar gas, etc., a sputter etching is performed so that the edge of the top of the lower electrode 5C is cut away for tapering. Although the step of tapering is not essential, this step is desirable for the reason that if the electrode structure has a sharp edge, field concentration might occur at the edge portion, leading to poor reliability and durability of the capacitor. The step of forming a sidewall lower electrode 7A as shown in FIGS. 12 and 13 is skipped, and a dielectric film 8 and upper electrode 9 are formed as shown in FIG. 14. This results in the stacked capacitor according to the sixth preferred embodiment.

In the stacked capacitor of the sixth preferred embodiment, the lower electrode 5C is formed of a single material, and therefore, unlike the first preferred embodiment, no interface is present between the sidewall lower electrode 7A and lower electrode core 5A. Thereby, no interface resistance is produced, thereby providing a lower electrode of a lower resistance. When compared to the first preferred embodiment, the stacked capacitor of the sixth preferred embodiment has a larger contact area between the dielectric film 8 and lower electrode 5C, and thus allows for a large electrostatic capacity.

With the method of manufacturing a stacked capacitor according to the sixth preferred embodiment, the step of tapering is added thereto, whereas the step of forming the top insulating film 6A shown in FIGS. 9 and 10, and the step of forming the sidewall lower electrode 7A shown in FIGS. 12 and 13 are omitted. This enables to simplify the manufacturing steps than the method according to the first preferred embodiment.

Seventh Preferred Embodiment

In the fourth preferred embodiment, it has been described that a noble metal such as platinum is preferably used for the material for the top conductive film 7B and is preferably deposited by sputtering or the like.

Figure 21:
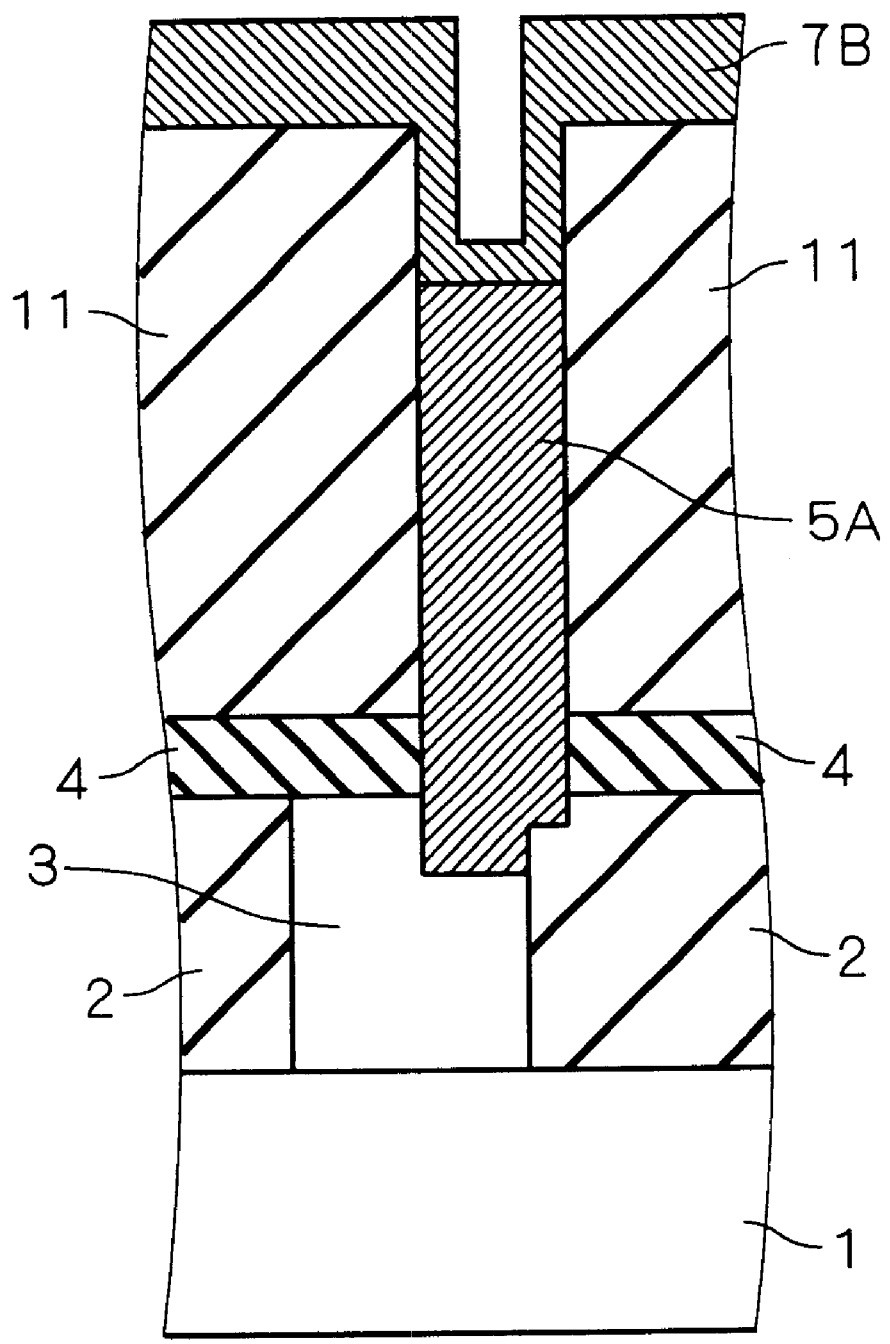
FIG. 21 is a cross section illustrating a problem encountered in manufacturing a stacked capacitor according to a fourth preferred embodiment.

However, when actually performing sputtering to form the top conductive film 7B of a noble metal such as platinum, the material for the top conductive film 7B may not be sufficiently buried in the top of the lower electrode core 5A (i.e., a depressed portion in the surface of the film to be etched 11) as shown in FIG. 21. In this case, when CMP, an etch back and the like are performed subsequently to remove the material for the top conductive film 7B on the film to be etched 11, it is not possible to form the top conductive film 7B on the top of the lower electrode core 5A with a sufficient film thickness. Insufficient film thickness of the top conductive film 7B may result in removal of the top conductive film 7B when the film to be etched 11 is removed as in the steps from FIG. 10 to FIG. 11.

Particularly in the case that an etch back is performed to remove the material for the top conductive film 7B on the film to be etched 11, a noble metal of the top of the lower electrode core 5A and a noble metal on the surface of the film to be etched 11 are formed to have substantially the same film thickness, so that the noble metal included in the depressed portion on the lower electrode core 5A is also easily removed when removing the noble metal on the surface of the film to be etched 11 by performing an etch back. At the etch back, the film thickness is made very thin, although the noble metal included in the depressed portion on the lower electrode core 5A is not completely removed because of the reburying phenomenon induced by the etch back.

Accordingly, in forming the top conductive film 7B, it is preferable to bury the material for the top conductive film 7B using CVD which is a deposition method excelling sputtering method in burying property. As described in the second preferred embodiment, however, some noble metal (e.g., platinum) cannot be well deposited by the existing technique of CVD method. Therefore, it is difficult to form the top conductive film 7B to have a sufficient film thickness in the case of employing such a noble metal that cannot be well deposited by the existing technique of CVD method.

A seventh preferred embodiment is directed to realize the method of manufacturing the stacked capacitor according to the fourth preferred embodiment in which a noble metal can be formed as a top conductive film having a sufficient film thickness even if the noble metal cannot be well deposited by the existing technique of CVD method.

First of all, as in the second preferred embodiment, the steps shown in FIGS. 2 to 8 are carried out to form the interlayer insulating film 2, conductive plug 3, insulating film 4, film to be etched 11 and lower electrode core 5A on the semiconductor substrate 1 having the element isolation region and the elements formed on the surface thereof.

Figure 22:
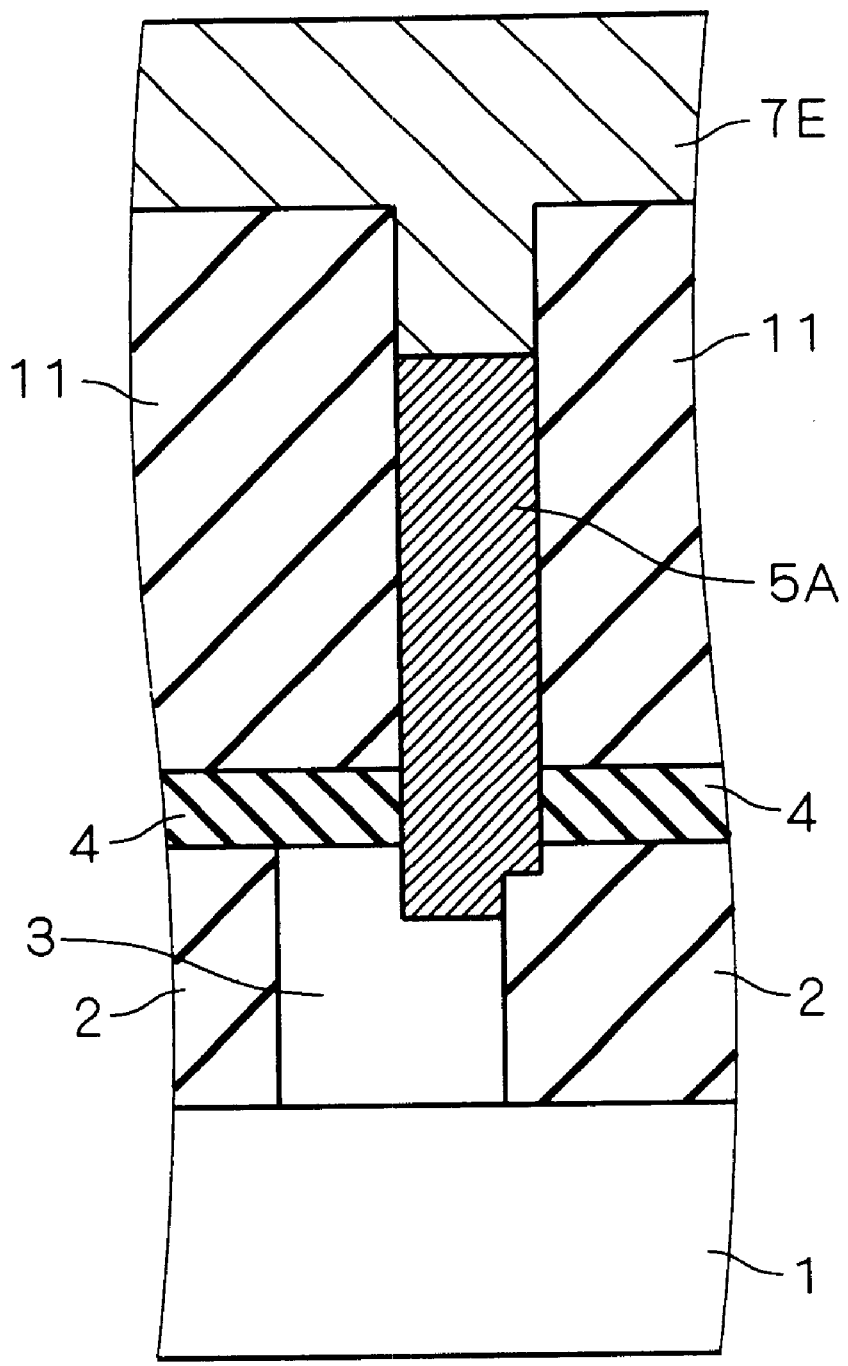
FIGS. 22 to 30 are cross sections illustrating a sequence of steps in a method of manufacturing a stacked capacitor according to a seventh preferred embodiment.

Referring to FIG. 22, a replacement metal 7E is formed on the film to be etched 11 using CVD method so as to be buried in the top of the lower electrode core 5A.

Selected for the replacement metal 7E is a material that can be well deposited by the existing technique of CVD method and a structural arrangement thereof can be replaced with a noble metal such as platinum by performing heat treatment. For instance, titanium is preferably used in the case where platinum is used for the material that is desired to be replaced. When titanium is used for the replacement metal 7E, it is preferable to deposit in a thickness of about 200 nm by means of CVD, at a deposition temperature of 600° C., and by using dichlorosilane and ammonia as a source gas.

Figure 23:
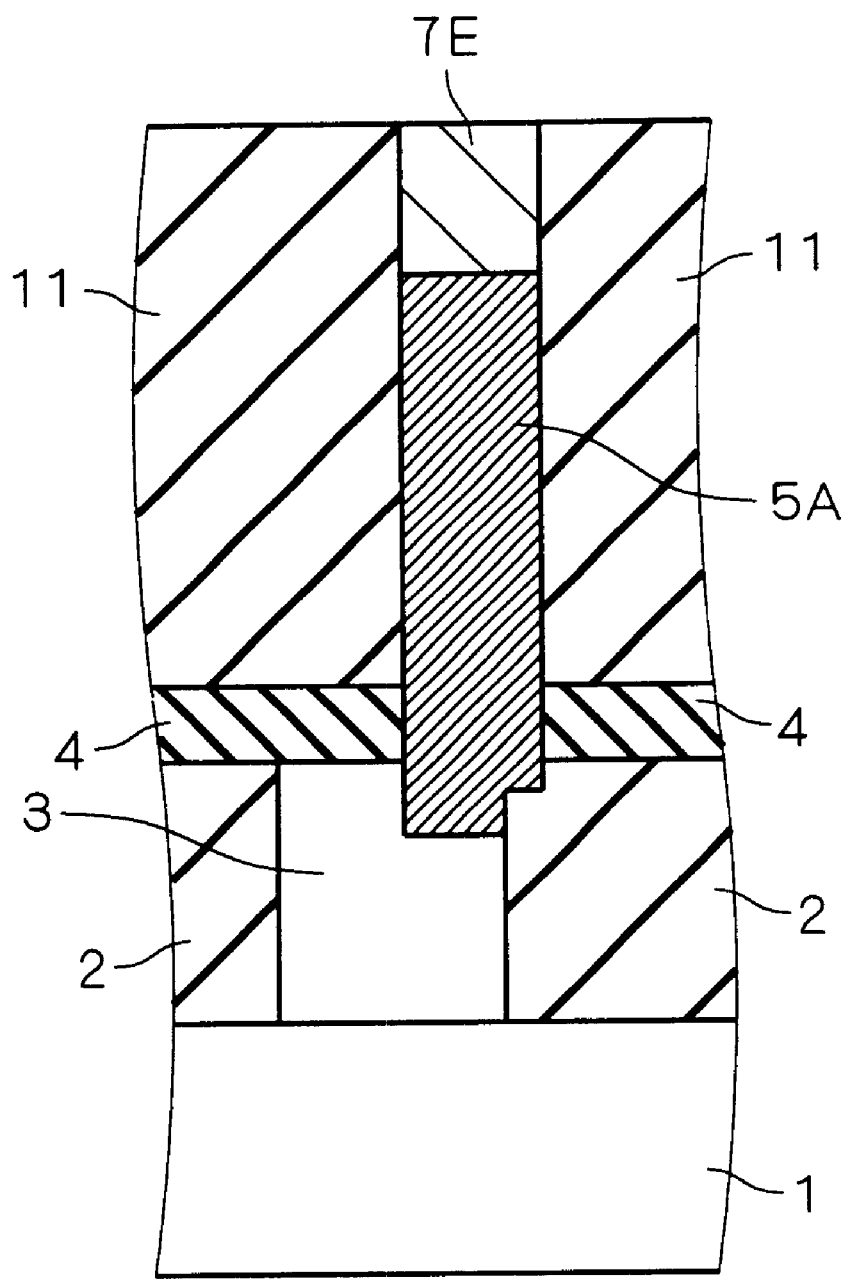

Referring to FIG. 23, by means of CMP or the like, the material for the replacement metal 7E existing on the film to be etched 11 is removed while leaving that material on the top of the lower electrode core 5A. It is preferable to use dry etching concurrently when it is difficult to remove the material for the replacement metal 7E only by means of CMP, e.g., when it is difficult to make polishing selection between the replacement metal 7E and the film to be etched 11.

Figure 24:
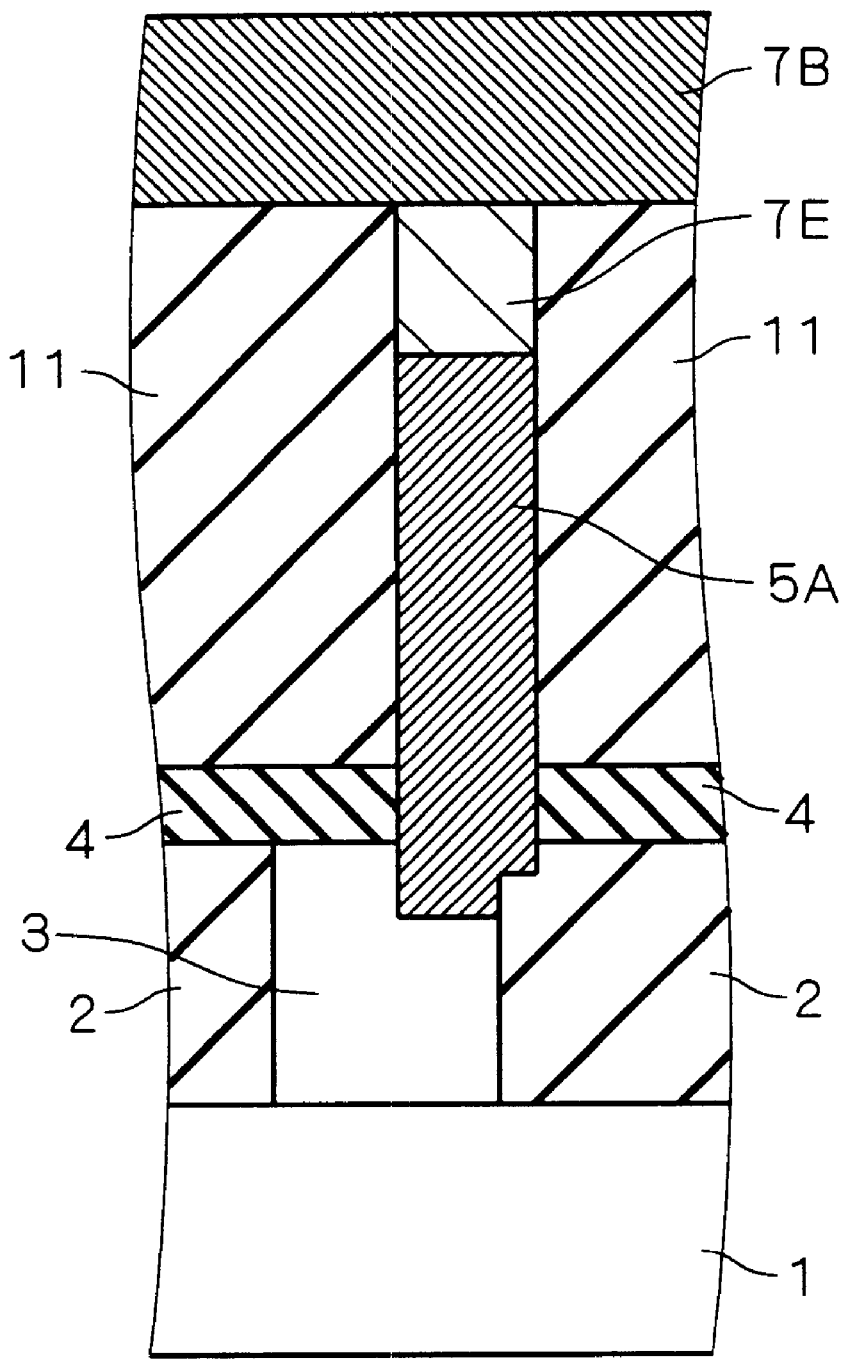

Referring to FIG. 24, a noble metal that cannot be well deposited by the existing technique of CVD method is formed, as the top conductive film 7B, on the film to be etched 11 and the replacement metal 7E. For instance, when platinum is used for the top conductive film 7B, it is preferable to deposit in a thickness of about 100 nm by sputtering at a temperature of 300° C. in an atmosphere of 1 Pa of argon. At this time, even by using sputtering method which is inferior to CVD in burying property, bases, i.e., the film to be etched 11 and the replacement metal 7E have flat surfaces so that there is no portion to be buried. This enables to form the material for the top conductive film 7E to be thick.

Figure 25:
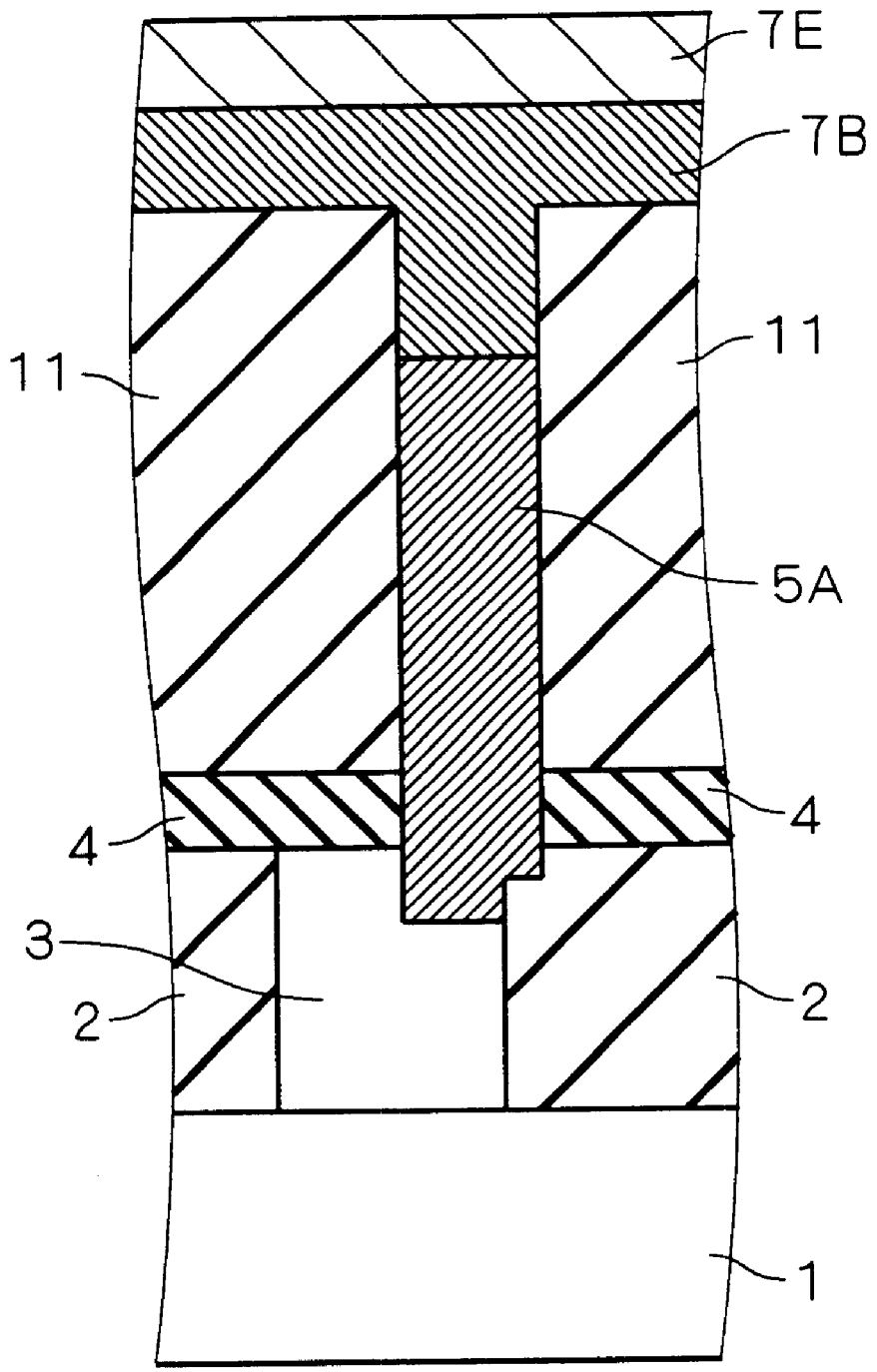

Referring to FIG. 25, the replacement metal 7E is replaced with the top conductive film 7B. For instance, when titanium for the replacement metal 7E and platinum for the top conductive film 7B are respectively employed, heating is performed at a temperature of 700° C. in an atmosphere of oxygen. Thereby, the titanium to be the replacement metal 7E is turned to be titanium oxide and extracted to surfaces. Then, the platinum to be the top conductive film 7B is replaced on the lower electrode core 5A where the replacement metal 7E has been existed.

Figure 26:
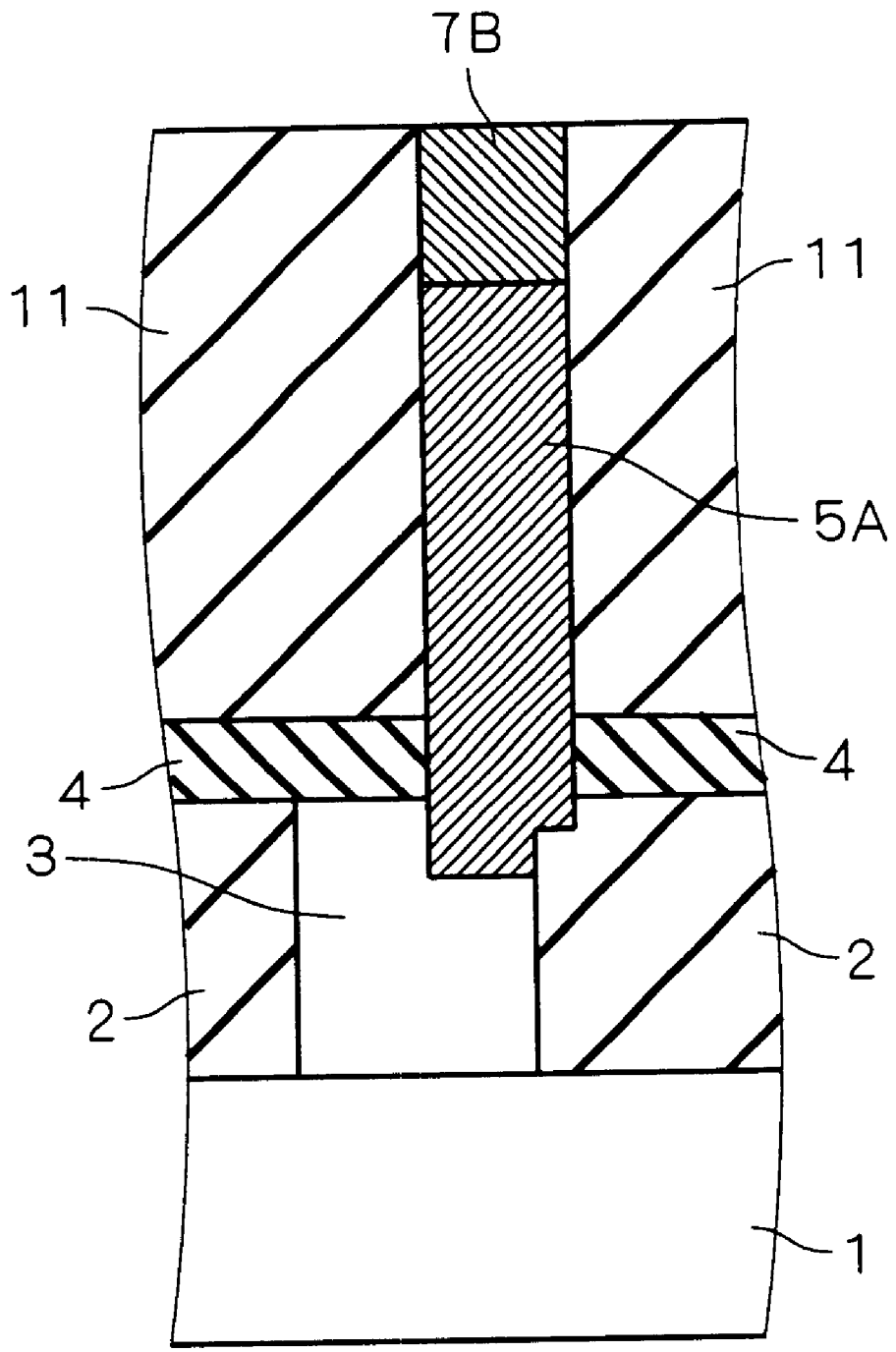

Referring to FIG. 26, the replacement metal 7E is removed, and the material for the top conductive film 7B existing on the film to be etched 11 is removed while leaving that material for the top conductive film 7B on the lower electrode core 5A. Thereby, the top conductive film 7B is formed on the top of the lower electrode core 5A. When the extracted replacement metal 7E is titanium oxide, it is preferably removed by means of wet etching, for example, and when the top conductive film 7B is platinum, it is preferable to perform dry etching, for example.

Figure 27:
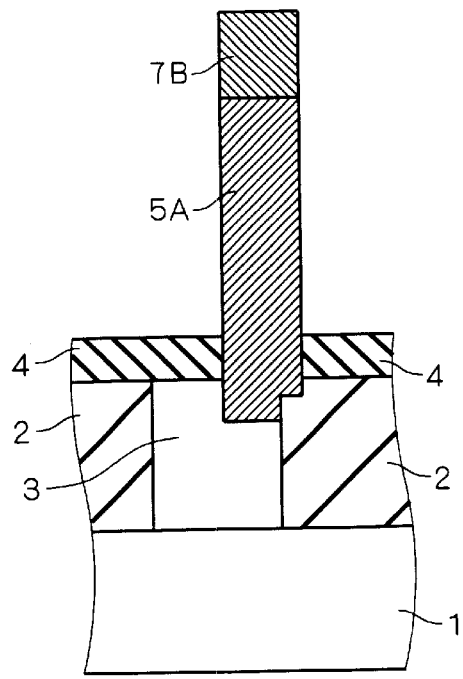

Referring now to FIG. 27, the film to be etched 11 is removed. If only a material having etching selectivity against the film to be etched 11 is used for the insulating film 4, lower electrode core 5A and top conductive film 7B, it is possible to remove the film to be etched 11 while leaving the insulating film 4, lower electrode core 5A and top conductive film 7B. By allowing the insulating film 4 to function as an etching stopper, the interlayer insulating film 2 can be left even when the same material is used for the film to be etched 11 and interlayer insulating film 2. For instance, when a silicon oxide film for the film to be etched 11, titanium nitride for the lower electrode core 5A, a silicon nitride film for the insulating film 4 and platinum for the top conductive film 7B are respectively employed, it is possible to remove only the film to be etched 11 while leaving the lower electrode core 5A, top conductive film 7B and minsulating film 4, by performing a wet etching using hydrofluoric acid.

Figure 28:
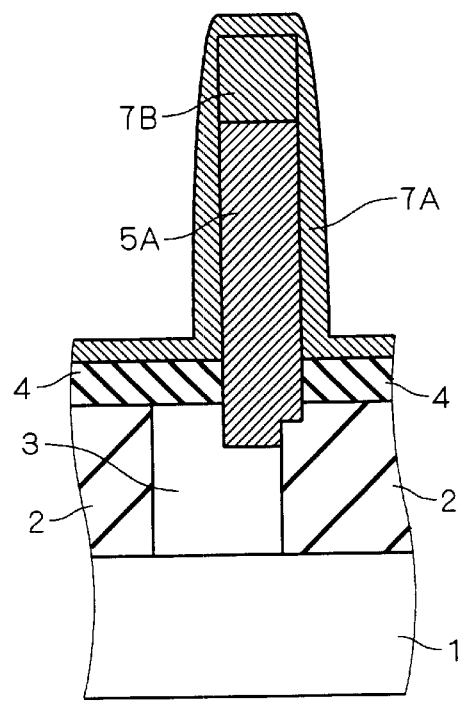

Referring to FIG. 28, a material for the sidewall lower electrode 7A is formed so as to cover the lower electrode core 5A, top conductive film 7B and insulating film 4. When a noble metal, e.g., platinum, is used for the sidewall lower electrode 7A, deposition by means of sputtering is suitable. For instance, the material for the sidewall lower electrode 7A is deposited so that it has a thickness of about 30 nm at the flat portion on the insulating film 4.

Figure 29:
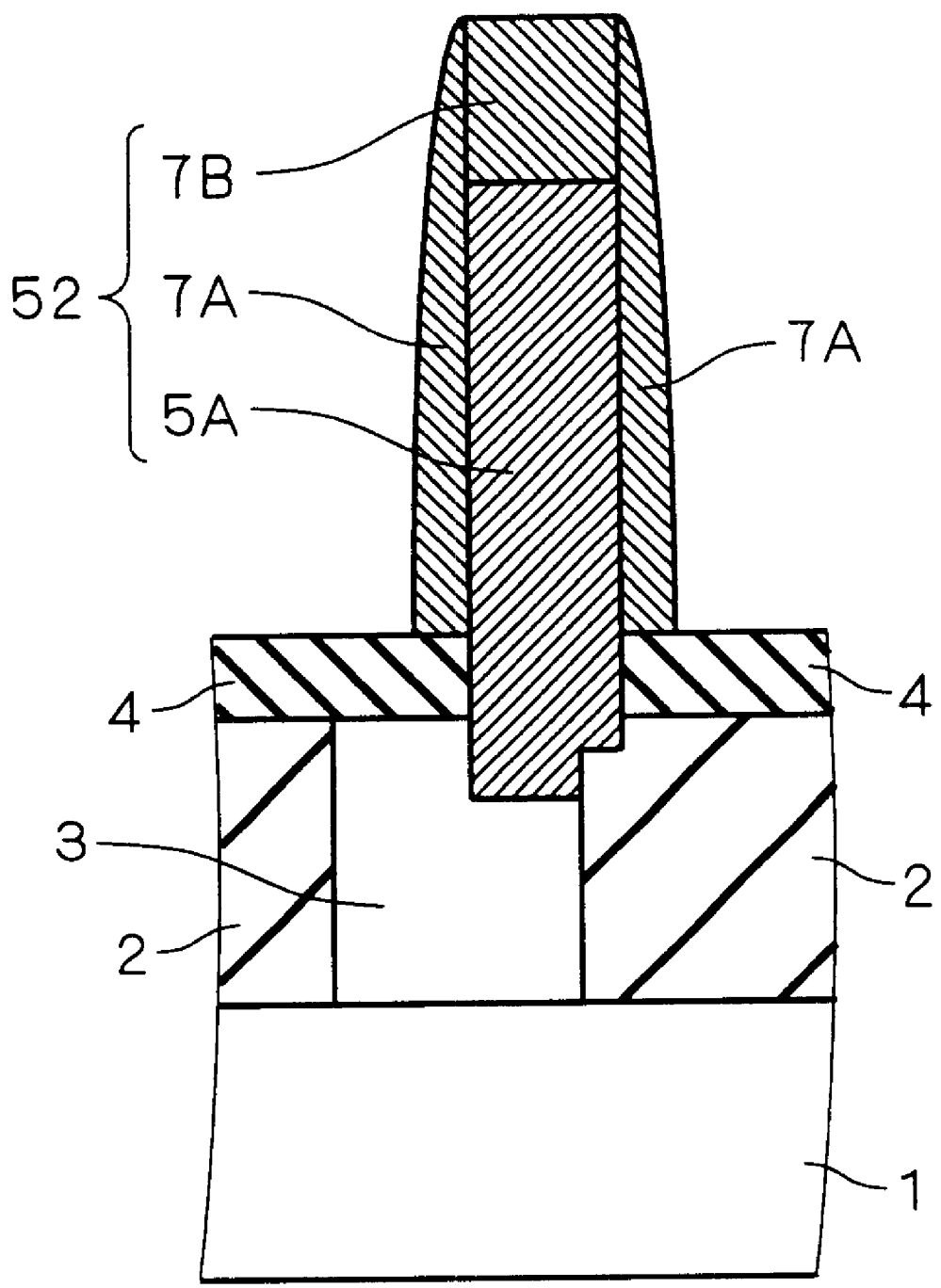

Referring to FIG. 29, an etch back of the material for the sidewall lower electrode 7A is performed to provide the sidewall lower electrode 7A on the side surfaces of the lower electrode core 5A and top conductive film 7B. This etch back enables removing of the material for the sidewall lower electrode 7A that exists on the insulating film 4 and top conductive film 7B. Also, due to this etch back, the sidewall lower electrode 7A is tapered along the lower electrode 5A and top conductive film 7B. Specifically, the lower electrode 52 has a gentle edge. It is therefore possible to manufacture a stacked capacitor with excellent reliability and durability, since it is hard to cause field concentration at the time of operation.

Figure 30:
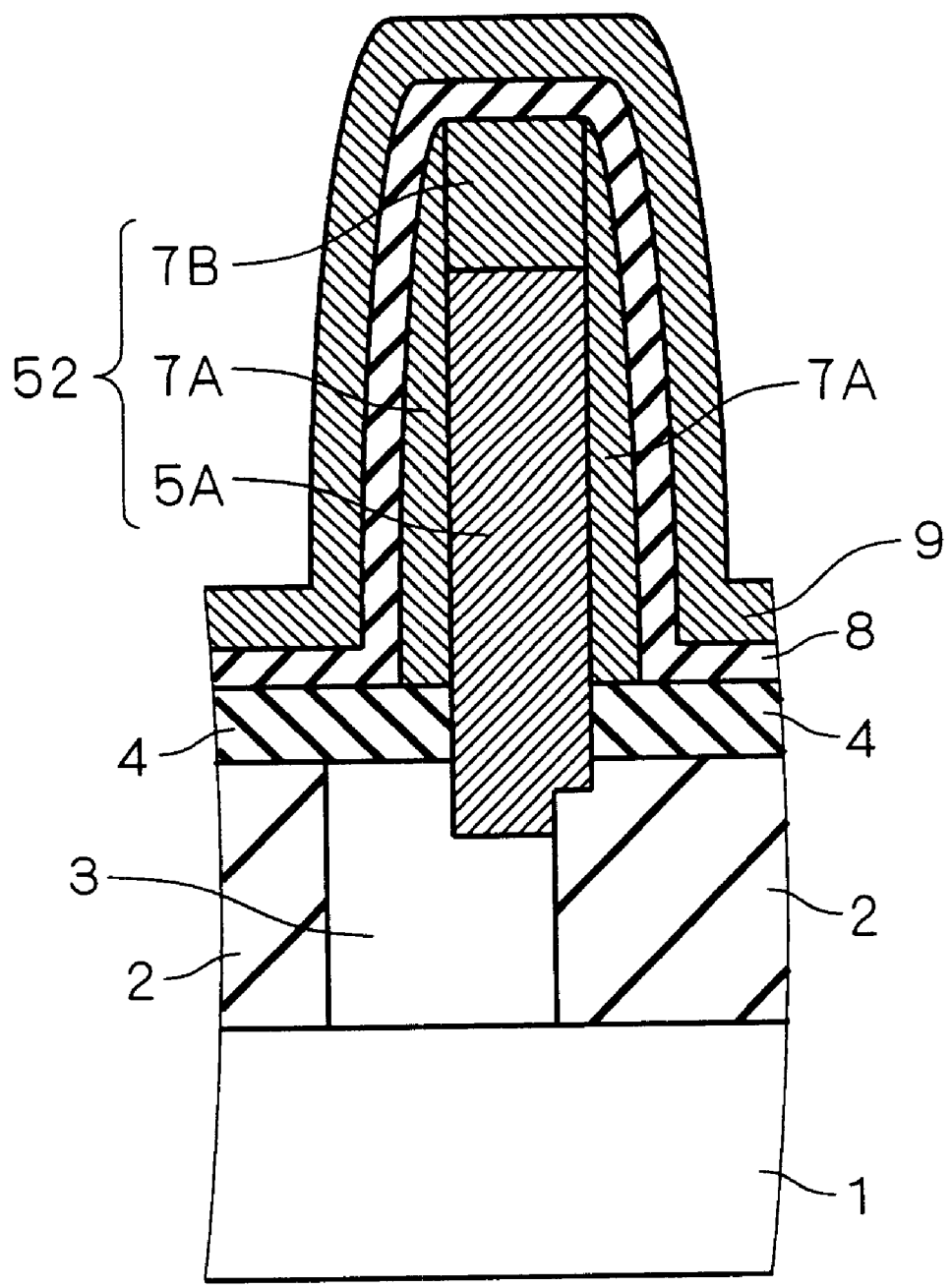

Referring to FIG. 30, a dielectric film 8 and an upper electrode 9 are formed in the order named. For instance, when a high dielectric constant material such as BST is used for the dielectric film 8, and a noble metal such as platinum is used for the upper electrode 9, both can be formed by sputtering. Of course, CVD may be employed for a noble metal that can be well deposited by the existing technique of CVD.

In order to avoid insufficient coverage on the side surfaces of the lower electrode 52, the dielectric film 8 is preferably formed so that it has a thickness of about 80 nm at the flat portion on the insulating film 4. This is true for the upper electrode 9.

Thereafter, as in the prior art, an interlayer insulating film 10 is formed on the upper electrode 9, and aluminum wiring (not shown) is formed. Accordingly, it is possible to manufacture the stacked capacitor as described in the fourth preferred embodiment.

With the method of manufacturing a stacked capacitor according to the present embodiment, the replacement metal 7E is formed on the top of the lower electrode core 5A and replaced with a noble metal to form the top conductive film 7B. This enables to obtain a structure into which a top conductive film having a sufficient film thickness is buried even if the material for the top conductive film cannot be well deposited by the existing technique of CVD.

A similar effect can be obtained provided that the material for the top conductive film has conductivity even when a part or the whole of the material is oxide or nitride. Of course, a noble metal that is relatively easy to bury, such as ruthenium, rhodium, palladium, osmium or iridium, may be used for the top conductive film.

Eighth Preferred Embodiment

An eighth preferred embodiment concerns another example of the method of manufacturing the stacked capacitor in the fourth preferred embodiment in which even a noble metal that cannot be well deposited by the existing technique of CVD can be formed as a top conductive film having a sufficient film thickness.

In the present embodiment, as in the seventh preferred embodiment, the steps shown in FIGS. 2 to 8 are carried out to form the interlayer insulating film 2, conductive plug 3, insulating film 4, film to be etched 11 and lower electrode core 5A on the semiconductor substrate 1 having the element isolation region and the elements formed on the surface thereof.

Figure 31:
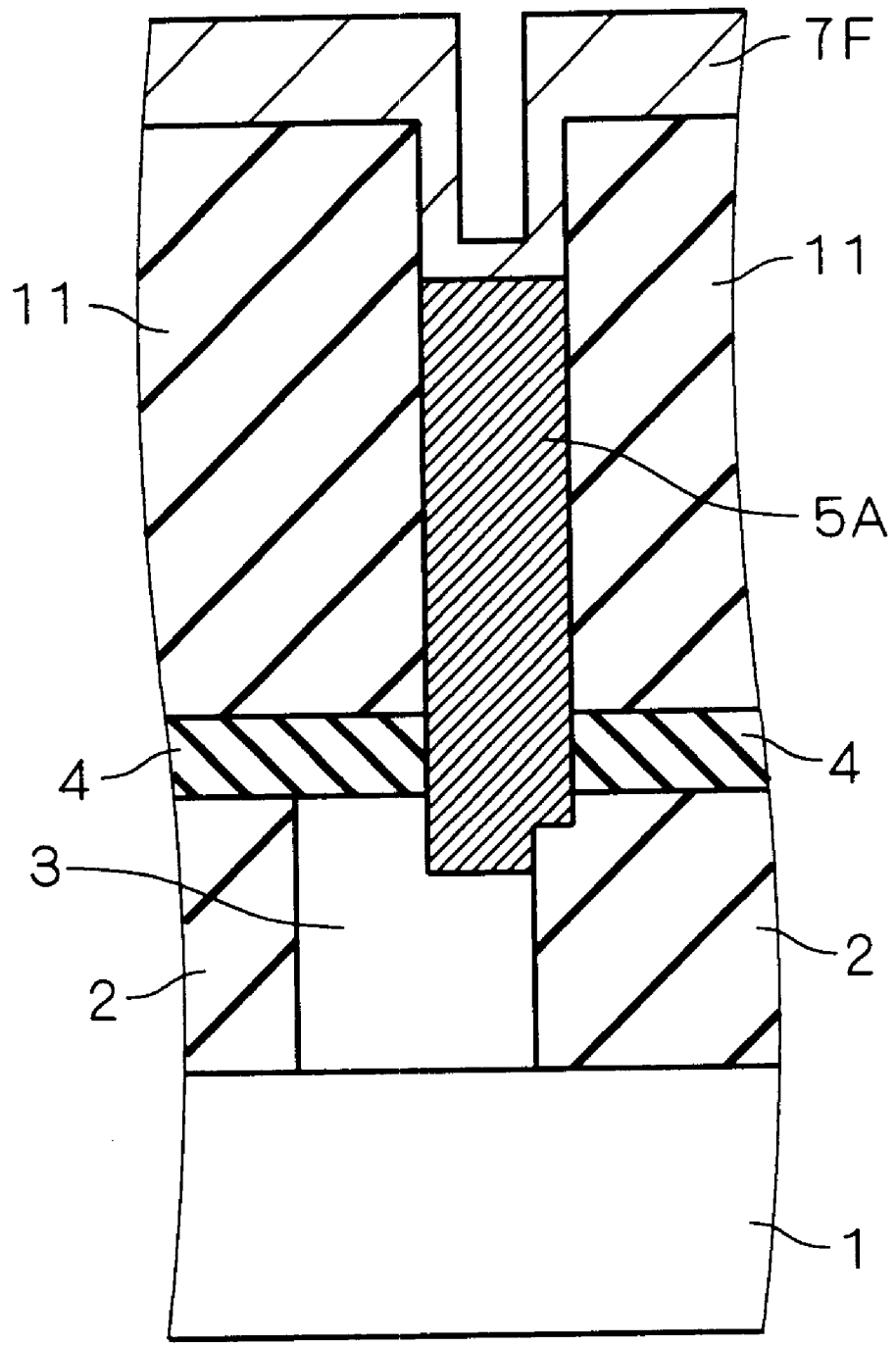
FIGS. 31 and 32 are cross sections illustrating a sequence of steps in a method of manufacturing a stacked capacitor according to an eighth preferred embodiment.

Referring to FIG. 31, a noble metal that cannot be well deposited by the existing technique of CVD is formed on the film to be etched 11 and lower electrode core 5A as a top conductive film 7F that is easy to melt when heated. For instance, when platinum is used for the top conductive film 7F, it is preferable to form the top conductive film 7F as a platinum including an oxygen component by sputtering at a deposition temperature of 300° C. in an atmosphere of 1 Pa of oxygen.

When deposition is performed by adding oxygen in this way, platinum has a property that its melting point decreases when heated in an atmosphere of nitrogen so that it becomes easier to melt. The oxygen content of the top conductive film 7F at this time is a minute quantity compared to the case that the whole of the top conductive film 7F is composed of platinum oxide. It is not clear whether the included oxygen exists as platinum oxide or exists separately from the platinum.

Figure 32:
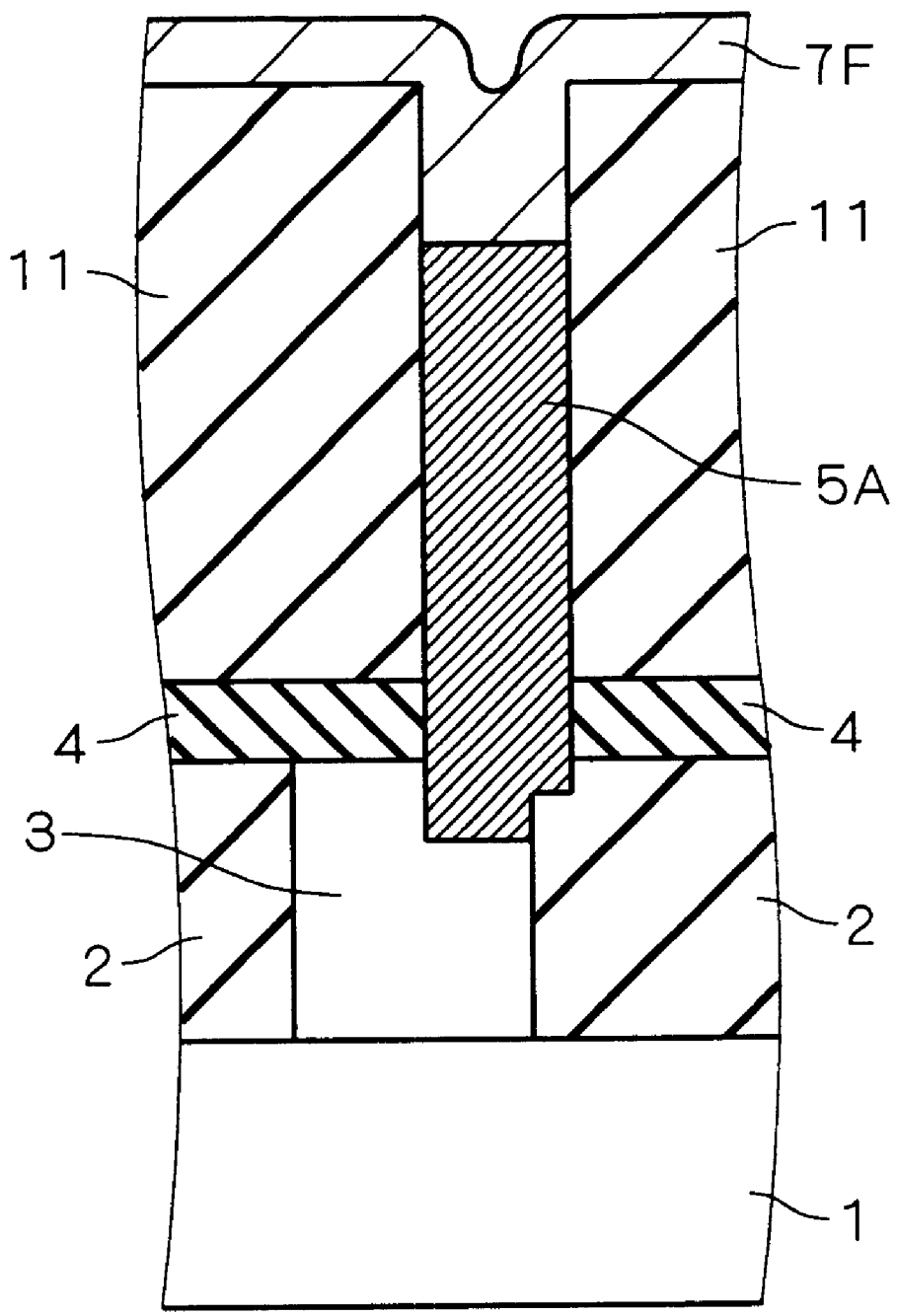

Referring to FIG. 32, the top conductive film 7F is heated and melted so that it flows into the depressed portion on the lower electrode core 5A. When platinum is used for the top conductive film 7F, the top conductive film 7F can be melted by heating at a temperature of 650° C., in an atmosphere of nitrogen, and for 30 minutes. At this time, the nitrogen does not enter the platinum, and the oxygen added in the platinum is easy to be removed from the platinum. A crystal grain of platinum glows at the melting and oxygen removing steps, so that platinum is easily buried in the depression on the lower electrode core 5A.

Thereafter, the top conductive film 7F is cooled to the room temperature. The material for the top conductive film 7F on the film to be etched 11 is removed by means of CMP, dry etching or the like while leaving the material for the top conductive film 7F on the top of the lower electrode core 5A.

As described in the seventh embodiment, the film to be etched 11 is then removed, and the side wall lower electrode 7A, dielectric film 8, upper electrode 9, interlayer insulating film 10 and aluminum wiring (not shown) are formed, which enables to manufacture the stacked capacitor according to the fourth embodiment.

With the method of manufacturing the stacked capacitor of the present embodiment, the conductive film 7F is heated and melted so that it flows into the depressed portion on the lower electrode core 5A. This enables to obtain a structure into which a top conductive film having a sufficient film thickness is buried even if the material for the top conductive film cannot be well deposited by the existing technique of CVD.

A similar effect can be obtained provided that the material for the top conductive film has conductivity even when a part or the whole of the material is oxide or nitride. Of course, a noble metal that is relatively easy to bury, such as ruthenium, rhodium, palladium, osmium or iridium, may be used for the top conductive film.

Ninth Preferred Embodiment

A ninth preferred embodiment also concerns another example of the method of manufacturing the stacked capacitor in the fourth preferred embodiment in which even a noble metal that cannot be well deposited by the existing technique of CVD can be formed as a top conductive film having a sufficient film thickness.

In the present embodiment, the steps shown in FIGS. 2 to 8 are carried out as in the seventh embodiment to form the interlayer insulating film 2, conductive plug 3, insulating film 4, film to be etched 11 and lower electrode core 5A on the semiconductor substrate 1 having an element isolation region and elements formed on the surface thereof.

Figure 33:
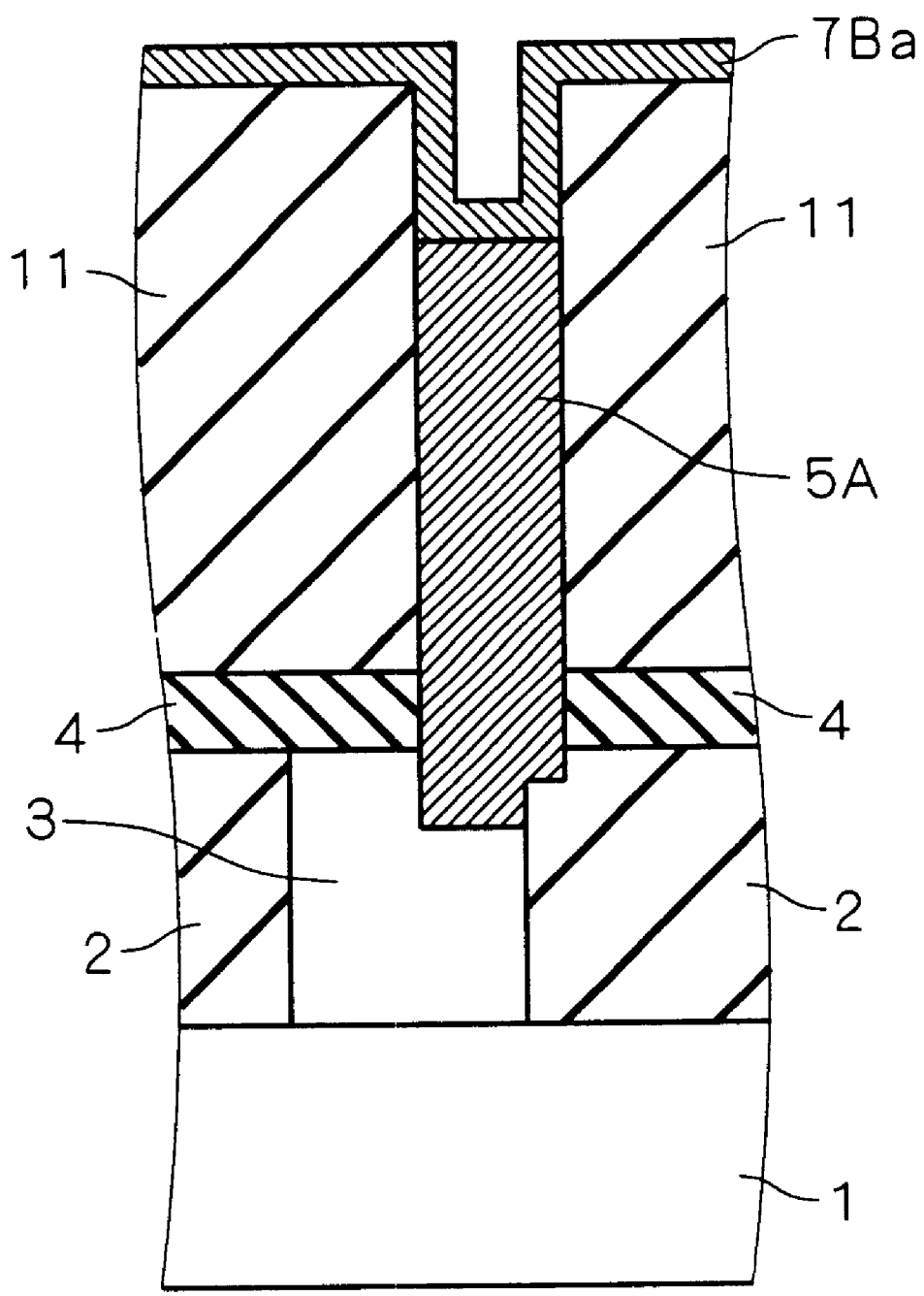
FIGS. 33 and 34 are cross sections illustrating a sequence of steps in a method of manufacturing a stacked capacitor according to a ninth preferred embodiment.

Referring to FIG. 33, a noble metal that cannot be well deposited by the existing technique of CVD is formed, as a top conductive film 7B$a$, on the film to be etched 11 and lower electrode core 5A. For instance, when platinum is used for the top conductive film 7B$a$, it is preferable to form the top conductive film 7B$a$ by sputtering.

Figure 34:
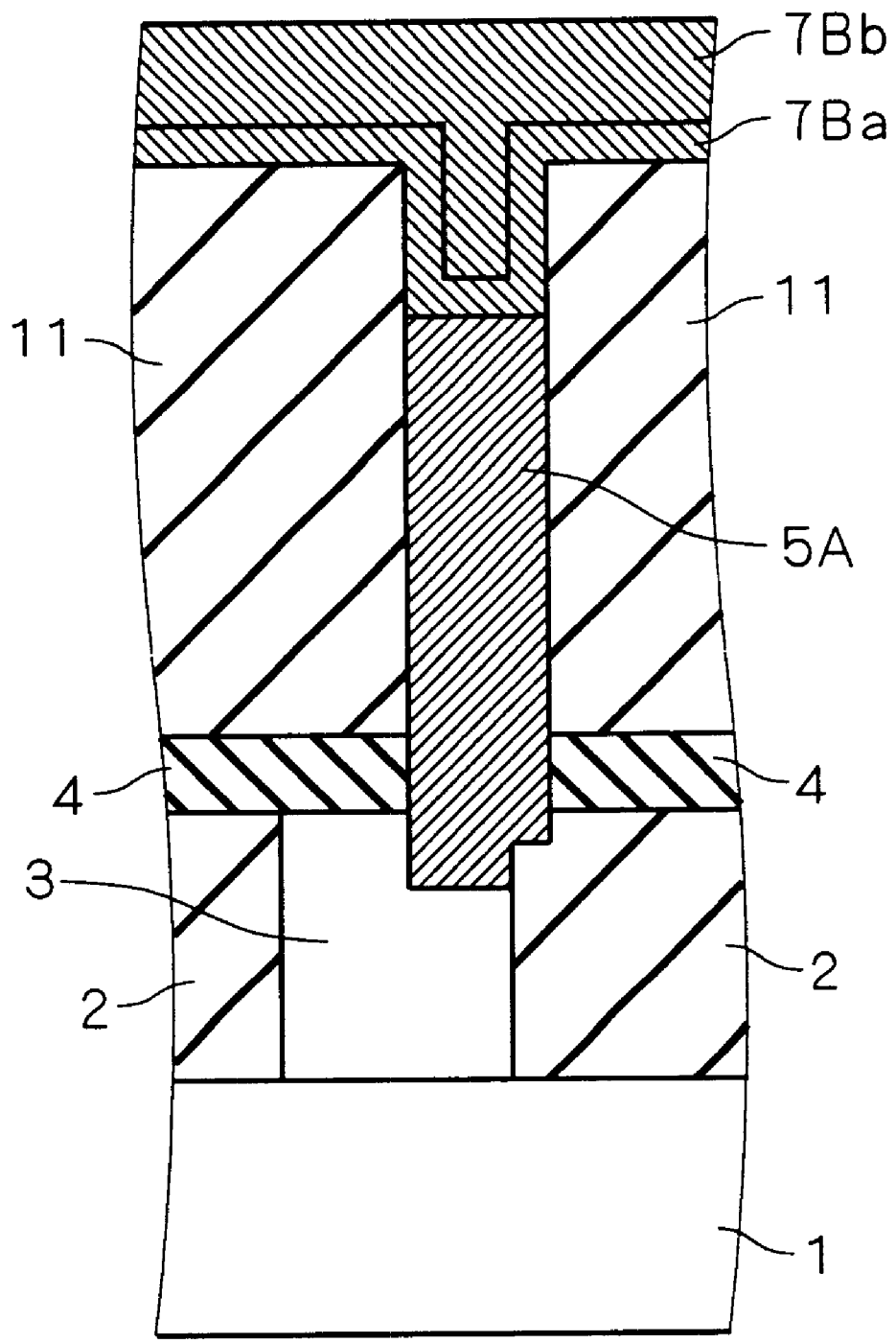

Referring to FIG. 34, plating is performed using the top conductive film 7B$a$ as an electrode to form a top conductive film 7B$b$ on the top of the conductive film 7B$a$. Plating for platinum has been applied to practical use as a depositing method having an excellent burying property. Therefore, platinum is easily buried into the depression on the lower electrode core 5A when platinum is used for the top conductive film 7B$b$.

Thereafter, the materials for the top conductive films 7B$a$ and 7B$b$ on the film to be etched 11 are removed by means of CMP, dry etching or the like while leaving the materials for the top conductive films 7B$a$ and 7B$b$ in the depression on the lower electrode core 5A.

As described in the seventh embodiment, the film to be etched 11 is then removed, and the side wall lower electrode 7A, dielectric film 8, upper electrode 9, interlayer insulating film 10 and aluminum wiring (not shown) are formed, which enables to manufacture the stacked capacitor according to the fourth embodiment.

With the method of manufacturing the stacked capacitor of the present embodiment, plating is performed using the top conductive film 7B$a$ as an electrode, and he top conductive film 7B$b$ is formed on the top conductive film 7B$a$. This enables to obtain a structure into which a top conductive film having a sufficient film thickness is buried even if the material for the top conductive film cannot be well deposited by the existing technique of CVD.

A similar effect can be obtained provided that the material for the top conductive film has conductivity even when a part or the whole of the material is oxide or nitride. Of course, a noble metal that is relatively easy to bury, such as ruthenium, rhodium, palladium, osmium or iridium, may be used for the top conductive film.

Tenth Preferred Embodiment

A tenth preferred embodiment also concerns another example of the method of manufacturing the stacked capacitor in the fourth preferred embodiment in which even a noble metal that cannot be well deposited by the existing technique of CVD can be formed as a top conductive film having a sufficient film thickness.

In the present embodiment, the steps shown in FIGS. 2 to 8 are carried out as in the seventh embodiment to form the interlayer insulating film 2, conductive plug 3, insulating film 4, film to be etched 11 and lower electrode core 5A on the semiconductor substrate 1 having the element isolation region and the elements formed on the surface thereof.

Figure 35:
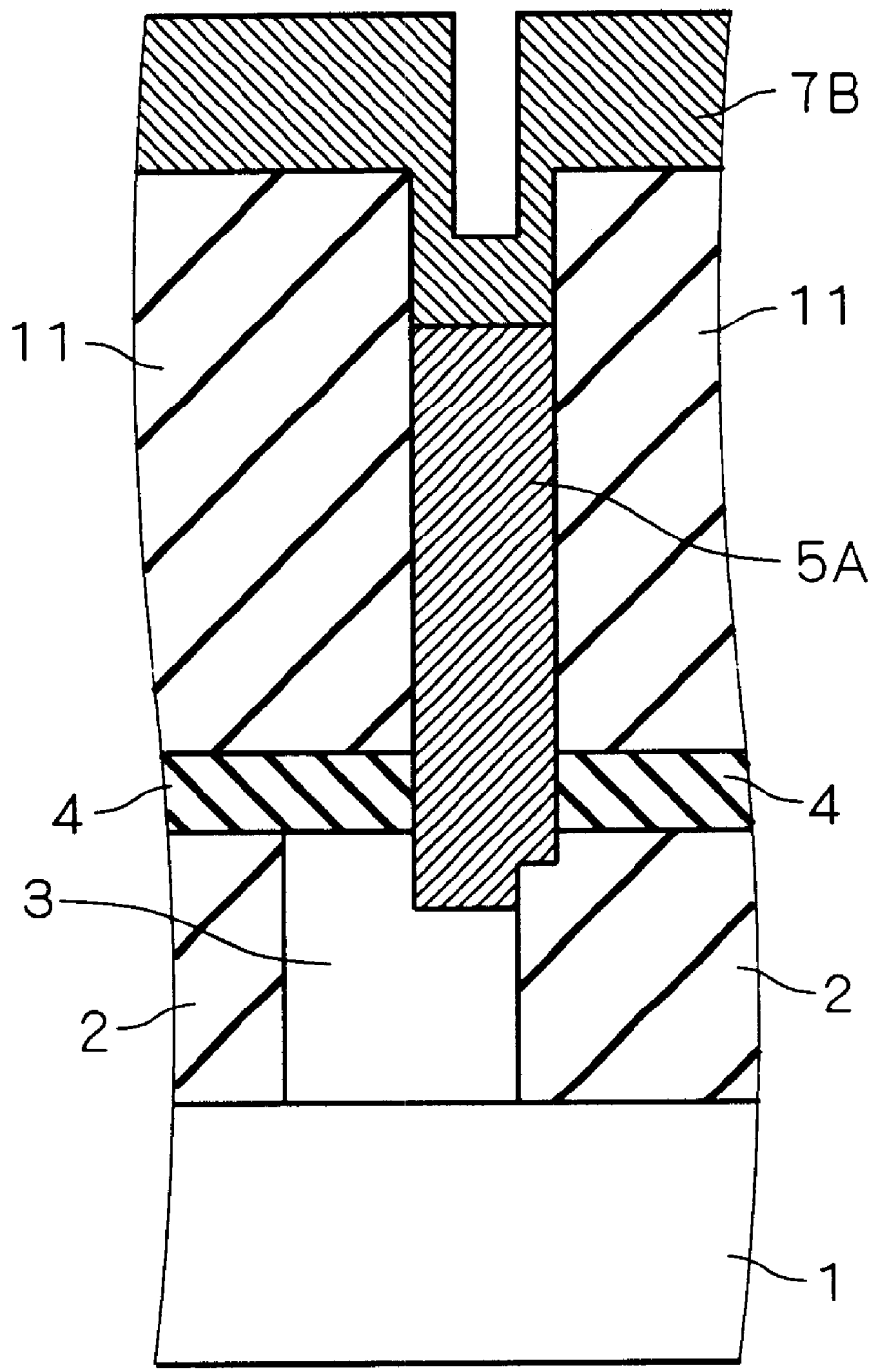
FIGS. 35 to 39 are cross sections illustrating a sequence of steps in a method of manufacturing a stacked capacitor according to a tenth preferred embodiment.

Referring to FIG. 35, a noble metal that cannot be well deposited by the existing technique of CVD is formed, as the top conductive film 7B, on the film to be etched 11 and lower electrode core 5A. For instance, when platinum is used for the top conductive film 7B, it is preferable to form the top conductive film 7B by sputtering at a deposition temperature of 300° C in an atmosphere of 1 Pa of Argon.

Figure 36:
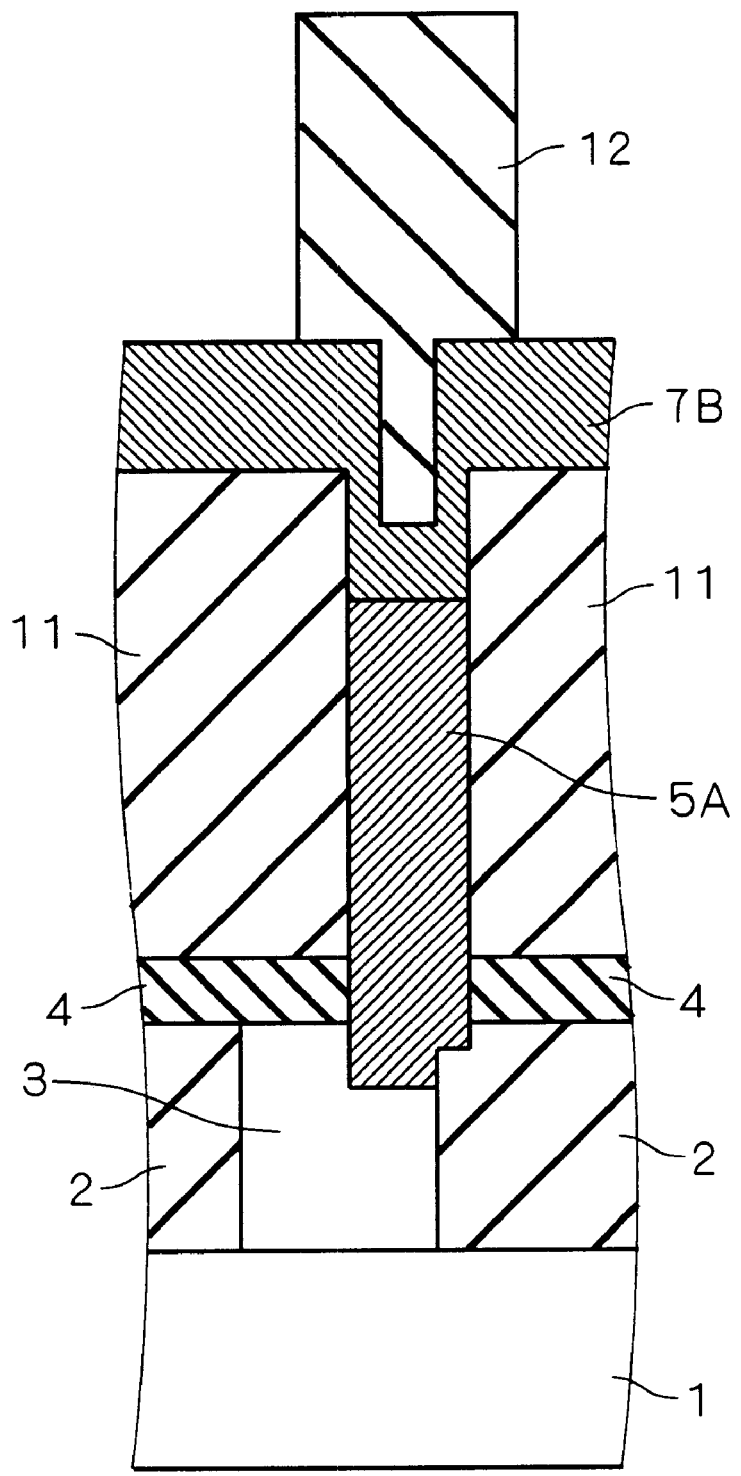

Referring to FIG. 36, the resist 12 is formed on the top conductive film 7B, and the resist 12 covering the lower electrode core 5A is patterned using the mask used in forming the pattern P1$a$ of the lower electrode core 5A in FIG. 4. At this time, the resist 12 is reversed to be positive or negative, thereby preferably forming a reversed pattern to the resist 12 shown in FIG. 4 using the same mask. An amount of light exposure at photolithography is adjusted so that the resist 12 is patterned to be slightly larger than the opening shape of the pattern P1$a$, thereby ensuring that the resist 12 covers the lower electrode core 5A.

Figure 37:
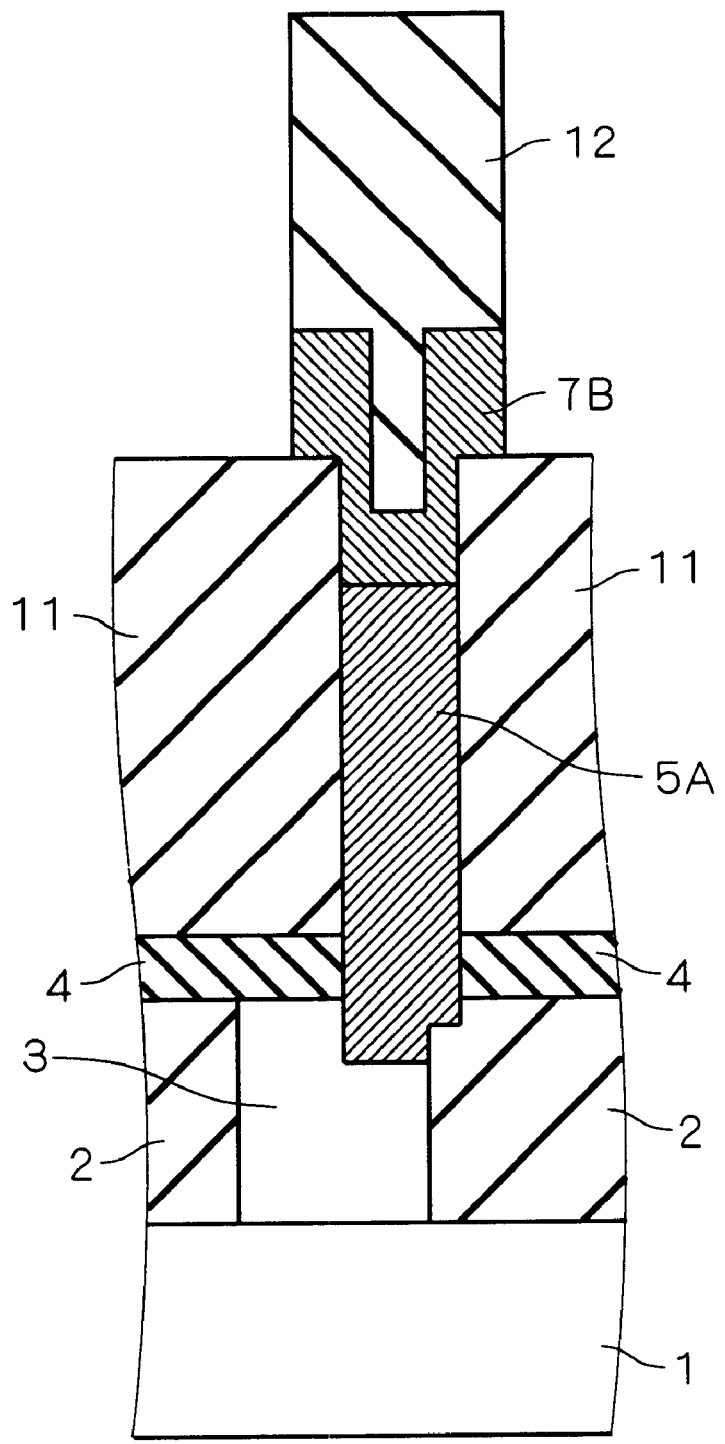
Figure 38:
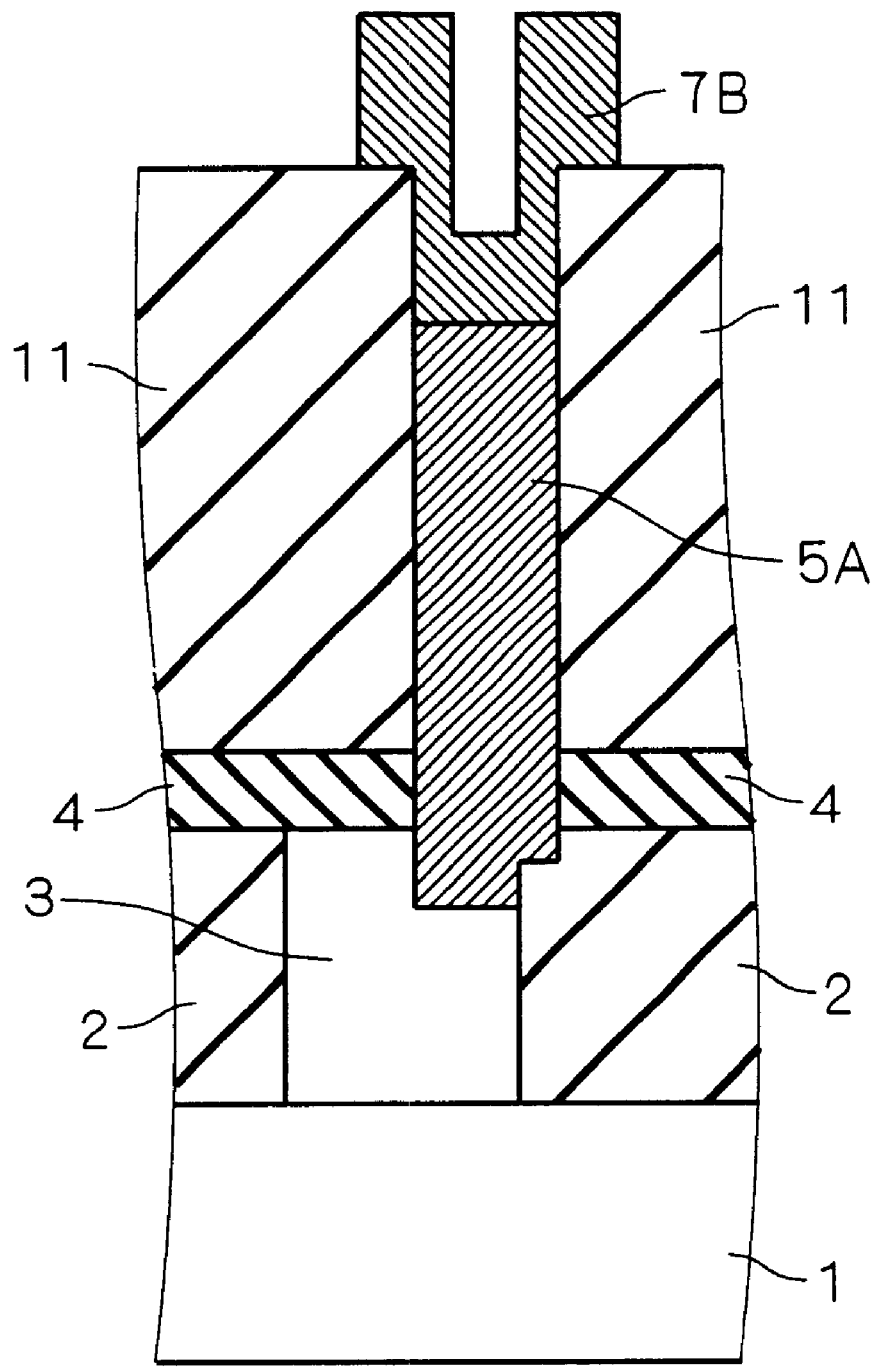
Figure 39:
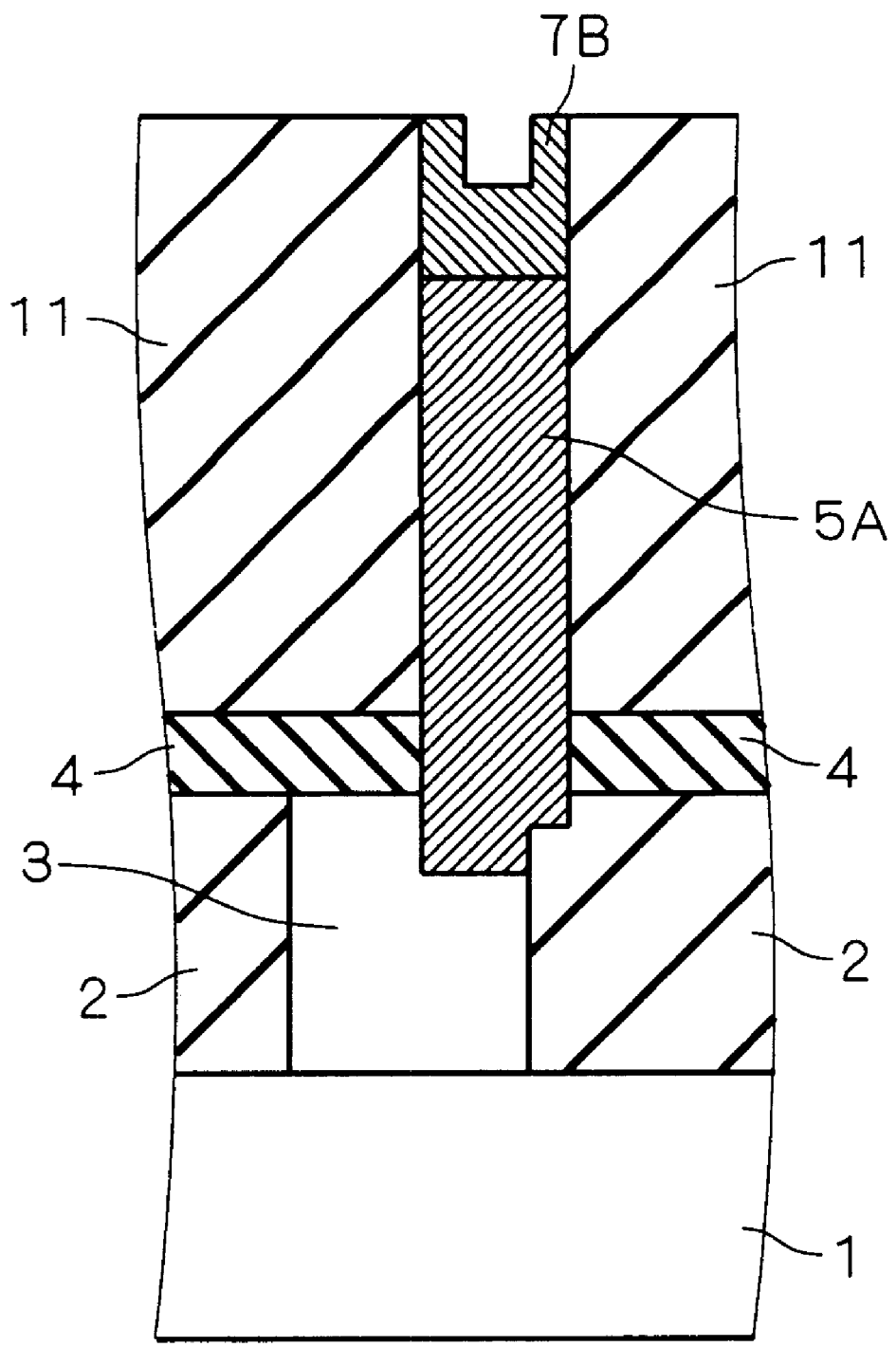

Referring to FIG. 37, etching is carried out for the top conductive film 7B using the resist 12 as a mask, thereby removing a portion of the top conductive film 7B on the film to be etched 11 which is not covered by the resist 12. As shown in FIG. 38, the resist 12 is then removed by ashing or the like. Thereafter, as shown in FIG. 39, an etch back is performed at a portion of the top conductive film 7B which exists above the surface of the film to be etched 11 by a necessary amount, while leaving the material for the top conductive film 7B in the depression on the lower electrode core 5A.

The portion of the top conductive film 7B on the film to be etched 11 which is not covered by the resist 12 has already been removed by this stage, so that it is not necessary to carry out an etch back for a long period of time. Therefore, the top conductive film 7B on the film to be etched 11 can be removed for a short period of time, which enables to reduce the film reduction amount of the top conductive film 7B. Thus, it is possible to maintain the film thickness of the top conductive film 7B to be thicker than in the case that an etch back is carried out just after the state shown in FIG. 21.

As in the seventh embodiment, the film to be etched 11 is removed to form the sidewall lower electrode 7A, dielectric film 8, upper electrode 9, interlayer insulating film 10 and aluminum wiring (not shown), which enables to manufacture the stacked capacitor according to the fourth embodiment.

According to the method of manufacturing the stacked capacitor in the present embodiment, a portion of the top conductive film 7B on the film to be etched 11 which is not covered by the resist 12 is previously removed, and then an etch back is carried out for a remaining portion of the top conductive film 7B by a necessary amount. This enables to remove a portion existing above the surface of the film to be etched 11 for a short period of time, thereby reducing the film reduction amount of the top conductive film 7B. Thus, it is possible to maintain the film thickness of the top conductive film 7B to be thicker than in the case that an etch back is carried out just after the state shown in FIG. 21. Consequently, a structure can be obtained into which a top conductive film having a sufficient film thickness is buried even if the material for the top conductive film cannot be well deposited by the existing technique of CVD.

A similar effect can be obtained provided that the material for the top conductive film has conductivity even when a part or the whole of the material is oxide or nitride. Of course, a noble metal that is relatively easy to bury, such as ruthenium, rhodium, palladium, osmium or iridium, may be used for the top conductive film.

While the invention has been shown and described in detail, the foregoing description is in all aspects illustrative and not restrictive. It is therefore understood that numerous modifications and variations can be devised without departing from the scope of the invention.

What is claimed is:

1. A stacked capacitor comprising:

a substrate having a main surface;

an interlayer insulating film disposed on said substrate;

a conductive plug extending through said interlayer insulating film and reaching said main surface of said substrate;

a surface-covering insulating film covering both said interlayer insulating film and said conductive plug;

a first conductive layer connected to said conductive plug, extending through and above said surface-covering insulating film, and configured to form a first electrode of said stacked capacitor;

a dielectric film disposed so as to cover said surface-covering insulating film and a part of said first conductive layer extending above said surface-covering insulating film; and a second conductive layer disposed so as to cover said dielectric film and configured to form a second electrode of said stacked capacitor.

2. The stacked capacitor according to claim 1, further comprising:

a top protective film disposed on a top surface of said first conductive layer; and a sidewall conductive layer disposed on side surfaces of both said first conductive layer and said top protective film.

3. The stacked capacitor according to claim 2, wherein said top protective film is a conductive film.

4. The stacked capacitor according to claim 2, further comprising a barrier metal conductive layer disposed between said sidewall conductive layer and said first conductive layer.

5. The stacked capacitor according to claim 1, wherein said first conductive layer is configured with a taper.

6. The stacked capacitor according to claim 1, wherein said first conductive layer projects into a part of said conductive plug and extends vertically from said conductive plug.

* * * * *